(12) United States Patent
Kim

(10) Patent No.: US 12,260,890 B2
(45) Date of Patent: *Mar. 25, 2025

(54) MEMORY DEVICE WHICH GENERATES IMPROVED WRITE VOLTAGE ACCORDING TO SIZE OF MEMORY CELL

(71) Applicant: Samsung Electronics Co., Ltd., Suwon-si (KR)

(72) Inventor: Daeshik Kim, Hwaseong-si (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 0 days.

This patent is subject to a terminal disclaimer.

(21) Appl. No.: 18/545,626

(22) Filed: Dec. 19, 2023

(65) Prior Publication Data

US 2024/0119983 A1    Apr. 11, 2024

Related U.S. Application Data

(62) Division of application No. 17/399,264, filed on Aug. 11, 2021, now Pat. No. 11,894,038.

(30) Foreign Application Priority Data

Aug. 12, 2020  (KR) .......................... 10-2020-0101344

(51) Int. Cl.
*G11C 11/16*    (2006.01)
(52) U.S. Cl.
CPC ...... *G11C 11/1675* (2013.01); *G11C 11/1655* (2013.01); *G11C 11/1657* (2013.01); *G11C 11/1673* (2013.01); *G11C 11/1697* (2013.01)

(58) Field of Classification Search
CPC ............ G11C 11/1675; G11C 11/1655; G11C 11/1657; G11C 11/1673; G11C 11/1697;
(Continued)

(56) References Cited

U.S. PATENT DOCUMENTS 6,462,981 B2    10/2002  Numata et al.
6,829,161 B2    12/2004  Huai et al.
(Continued)

FOREIGN PATENT DOCUMENTS

JP        H069067 B2       2/1994
JP        2010102767 A     5/2010
(Continued)

OTHER PUBLICATIONS

IC Card System; Nakano Harumi; (Year: 1994).

*Primary Examiner* — Sultana Begum
(74) *Attorney, Agent, or Firm* — Harness, Dickey & Pierce, P.L.C.

(57) ABSTRACT

Disclosed is a memory device including a magnetic memory element. The memory device includes a memory cell array including a first region and a second region, the second region configured to store a value of a write voltage, the write voltage based on a value of a reference resistor for determining whether a programmed memory cell is in a parallel state or anti-parallel state, a voltage generator configured to generate a code value based on the value of the write voltage, and a write driver configured to drive a write current based on the code value, the write current being a current for storing data in the first region.

13 Claims, 18 Drawing Sheets

(58) Field of Classification Search
CPC ............... G11C 11/161; G11C 29/021; G11C 29/12005; G11C 29/006; G11C 29/028; G11C 2029/0409
See application file for complete search history.

(56) References Cited

U.S. PATENT DOCUMENTS

| | | | |
|---|---|---|---|
| 6,990,015 B2 | 1/2006 | Honda et al. |
| 7,075,813 B2 | 7/2006 | Moriyama et al. |
| 7,102,948 B2 | 9/2006 | Perner |
| 7,151,647 B2 | 12/2006 | Sasaki et al. |
| 7,224,630 B2 | 5/2007 | Andre et al. |
| 7,453,719 B2 | 11/2008 | Sakimura et al. |
| 7,639,522 B2 | 12/2009 | Cho et al. |
| 7,796,460 B2 | 9/2010 | Matsufuji et al. |
| 7,881,094 B2 | 2/2011 | Chen et al. |
| 7,920,405 B2 | 4/2011 | Kang et al. |
| 8,116,117 B2 | 2/2012 | Cho et al. |
| 8,184,470 B2 | 5/2012 | Toda et al. |
| 8,441,847 B2 | 5/2013 | Eleftheriou et al. |
| 8,902,628 B2 | 12/2014 | Ha et al. |
| 9,025,357 B2 | 5/2015 | Chung |
| 9,153,318 B2 | 10/2015 | Yim |
| 9,159,381 B2 | 10/2015 | Li et al. |
| 9,165,629 B2 | 10/2015 | Chih et al. |
| 9,177,627 B2 | 11/2015 | Chen et al. |
| 9,183,910 B2 | 11/2015 | Lee et al. |
| 9,251,881 B2 | 2/2016 | Kim et al. |
| 9,251,893 B2 | 2/2016 | Chung |
| 9,406,367 B2 | 8/2016 | Chih et al. |
| 9,455,013 B2 | 9/2016 | Kim et al. |
| 9,552,863 B1 | 1/2017 | Andre et al. |
| 9,666,792 B2 | 5/2017 | Chen et al. |
| 9,672,886 B2 | 6/2017 | Wang et al. |
| 9,679,643 B1 | 6/2017 | Chou |
| 10,102,896 B2 | 10/2018 | Jan et al. |
| 10,163,479 B2 | 12/2018 | Berger et al. |
| 10,304,511 B1 | 5/2019 | Alam et al. |
| 10,347,314 B2 | 7/2019 | Berger et al. |
| 10,430,534 B2 | 10/2019 | Gharia |
| 10,861,524 B1 | 12/2020 | Roy et al. |
| 11,087,799 B1 | 8/2021 | Sakhare |
| 11,139,012 B2 | 10/2021 | Pyo et al. |
| 11,410,704 B2 | 8/2022 | Lau et al. |
| 11,521,692 B2 | 12/2022 | Choy et al. |
| 11,646,089 B2 * | 5/2023 | Choi .................. G11C 16/32 365/185.22 |
| 2008/0285335 A1 | 11/2008 | Elmegreen et al. |
| 2014/0010026 A1 * | 1/2014 | Kim ..................... G11C 7/00 365/189.07 |
| 2014/0192588 A1 | 7/2014 | Lee et al. |
| 2018/0366187 A1 | 12/2018 | Chien et al. |
| 2019/0221242 A1 | 7/2019 | Andre et al. |
| 2019/0348096 A1 | 11/2019 | Antonyan et al. |
| 2022/0084591 A1 | 3/2022 | Kim |

FOREIGN PATENT DOCUMENTS

| | | |
|---|---|---|
| JP | 2018170065 A | 11/2018 |
| KR | 10-2012-0094644 A | 8/2012 |
| KR | 10-2019-0127288 A | 11/2019 |

* cited by examiner

MEMORY DEVICE WHICH GENERATES IMPROVED WRITE VOLTAGE ACCORDING TO SIZE OF MEMORY CELL

CROSS-REFERENCE TO RELATED APPLICATIONS

This application is a divisional of Ser. No. 17/399,264 filed on Aug. 11, 2021, which claims priority under 35 U.S.C. § 119 to Korean Patent Application No. 10-2020-0101344 filed on Aug. 12, 2020, in the Korean Intellectual Property Office, the contents of which are incorporated by reference herein in their entireties.

BACKGROUND

Some example embodiments relate to a semiconductor device, and more particularly, relate to a memory device including a magnetic tunnel junction element and/or a method for testing and operating the semiconductor device.

Nowadays, various types of electronic devices are being used. As a high-speed and low-power electronic device is desired, the electronic device may require a memory device satisfying at least some of the following: high reliability, high speed, and low power consumption. To satisfy the desirables, a magnetic memory element has been suggested as a storage element of the memory device. Because the magnetic memory element operates at a high speed and is nonvolatile, the magnetic memory element is on the spotlight as a next-generation semiconductor memory element.

In general, the magnetic memory element may include a magnetic tunnel junction (MTJ), e.g. an MTJ element. The MTJ element may include two magnetic materials and an insulating layer interposed therebetween. A resistance value of the MTJ element may vary depending on magnetization directions of the two magnetic materials. For example, the MTJ element may have a great resistance value when the magnetization directions of the two magnetic materials are anti-parallel to each other and may have a smaller resistance value when the magnetization directions of the two magnetic materials are parallel to each other. Data may be written or read by using a difference between the resistance values.

Meanwhile, with regard to the reliability and/or endurance desired for the magnetic memory element, the memory device may be problematic in endurance when the memory device is written by using an excessive magnitude of voltage and/or current and may be problematic in reliability when the memory device is written by using an insufficient magnitude of voltage and/or current. In particular, because a value of a write voltage and/or current is stored in the memory device by a memory vendor/supplier during a test (e.g. a wafer test) process, if once determined, the value of the write voltage and/or current may have a large influence on the performance of the memory device.

SUMMARY

Some example embodiments provide a device and/or a method capable of determining a value of an improved, e.g. an optimal reference resistor through a small, e.g. a minimum number of times of a write operation and determining a value of an improved, e.g. an optimal write voltage based on the value of the reference resistor thus determined.

According to some example embodiments, a memory device includes a memory cell array including a first region and a second region, the second region configured to store a value of a write voltage, the write voltage based on a value of a reference resistor for determining whether a programmed memory cell is in a parallel state or anti-parallel state, a voltage generator configured to generate a code value based on the value of the write voltage, and a write driver configured to drive a write current based on the code value, the write current being a current for storing data in the first region.

According to some example embodiments, an operating method of a memory device includes writing a memory device to a first state, counting fail bits of the memory device that are programmed to the first state by using a first plurality of resistors having different values, the first plurality of resistors corresponding to each of a plurality of reference resistors, writing the memory device to a second state, counting fail bits of the memory device that are programmed to the second state by using the first plurality of resistors, selecting a selected reference resistor from the first plurality of resistors based on (A) the counting results associated with the first state and (B) the counting results associated with the second state, and determining a value of a write voltage for the memory device based on a value of the selected reference resistor.

According to some example embodiments, a memory device includes a memory cell array including a first region and a second region, the second region configured to store a value of a reference resistor and a value of a write voltage, the value of the write voltage determined based on the value of the reference resistor, the value of the reference resistor determined based on (A) a first result of counting a number of fail bits of the first region programmed to a first state for each resistance value of a plurality of resistance values and (B) a second result of counting a number of fail bits of the first region programmed to a second state for each resistance value of the plurality of resistance values, a column decoder configured to select a bit line connected with a memory cell, the memory cell selected from memory cells of the first region, a row decoder configured to drive a word line connected with the selected memory cell, a voltage generator configured to generate a code value based on the value of the write voltage, and a write driver configured to drive a write current and to provide the driven write current to the selected memory cell through the selected bit line, the write current being a current for storing data in the selected memory cell, the write current based on the code value.

BRIEF DESCRIPTION OF THE FIGURES

The above and other objects and features of example embodiments will become apparent by describing in detail embodiments thereof with reference to the accompanying drawings.

DETAILED DESCRIPTION OF SOME EXAMPLE EMBODIMENTS

Below, some example embodiments of inventive concepts may be described in detail and clearly to such an extent that a person of ordinarily skilled in the art may easily implement some example embodiments.

Some components that are described in the detailed description with reference to the terms "unit", "module", "block", "circuit", "~er" or "~or", "table", "device", "region", etc. and/or function blocks illustrated in drawings may be implemented with software, hardware, or a combination thereof. For example, the software may be or include a machine code, firmware, an embedded code, or application software, and may be stored in a transient or in a non-transient manner. For example, the hardware may include processing circuitry such as an electrical circuit, an electronic circuit, a computer, an integrated circuit, integrated circuit cores, an FPGA, a pressure sensor, an inertial sensor, a microelectromechanical system (MEMS), a passive element, or a combination thereof.

Figure 1:
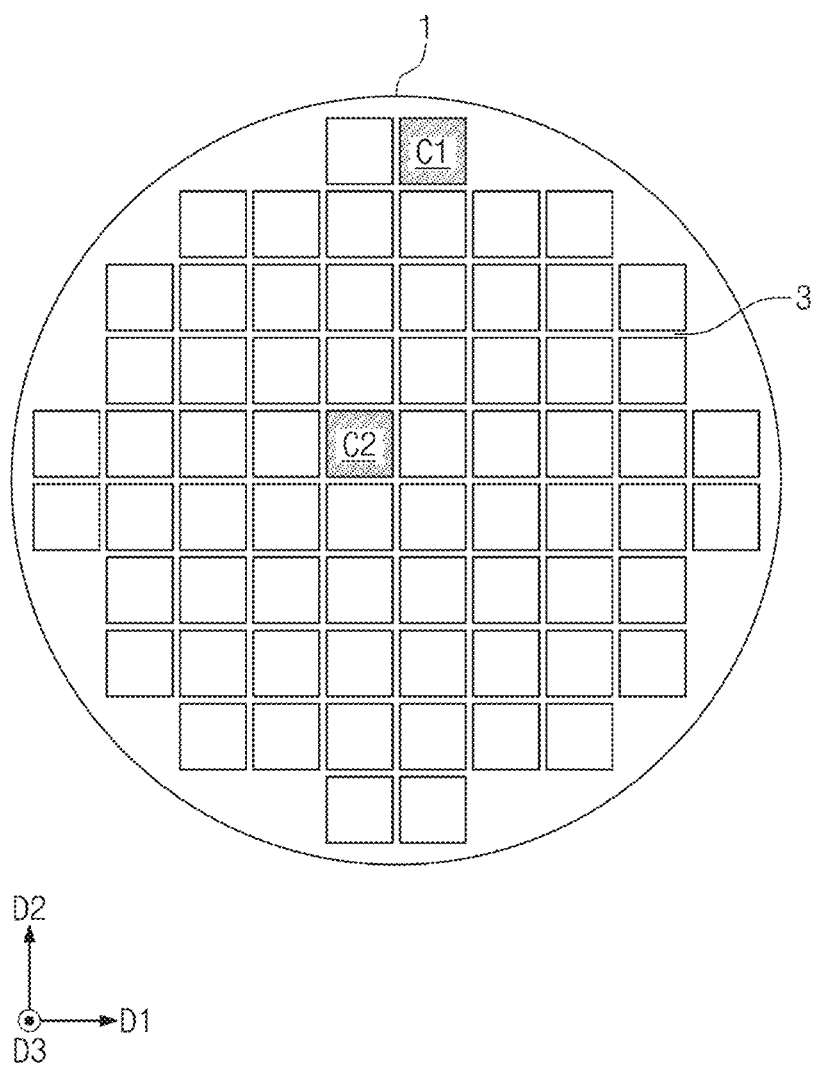
FIG. 1 illustrates a substrate where memory devices according to some example embodiments of inventive concepts are integrated.

FIG. 1 illustrates a substrate 1 where memory devices according to some example embodiments of inventive concepts are integrated. The substrate 1 may include a plurality of die, or devices, such as memory devices including a first memory device C1 and a second memory device C2, and a scribe line region 3 between the memory devices. The memory devices may be two-dimensionally arranged in a first direction D1 and a second direction D2. Each memory device may be surrounded by the scribe line region 3. For example, the scribe line region 3 may be defined between memory devices adjacent in the first direction D1 and between memory devices adjacent in the second direction D2. Additionally although a certain number of die are illustrated in FIG. 1, example embodiments are not limited to the number illustrated in FIG. 1, and may be more than, or less than, those illustrated in FIG. 1. Still further although the die are illustrated as being square, example embodiments are not limited thereto, and a shape of the die may be another shape such as another rectangular shape.

In some example embodiments, the substrate 1 may be or include a semiconductor substrate such as a semiconductor wafer. The substrate 1 may be or include a bulk silicon substrate, a silicon on insulator (all) substrate, a germanium substrate, a germanium on insulator (GOI) substrate, a silicon-germanium substrate, and/or a substrate of an epitaxial thin film formed through selective epitaxial growth (SEG). For example, the substrate 1 may include at least one of silicon (Si), germanium (Ge), silicon germanium (SiGe), gallium arsenic (GaAs), Indium Gallium Arsenide (InGaAs), aluminum gallium arsenide (AlGaAs), or a mixture thereof. The substrate 1 may have a single crystalline structure. The substrate 1 may be doped, e.g. may be lightly doped with P-type impurities; however, example embodiments are not limited thereto. Furthermore although the substrate 1 is illustrated as being circular, example embodiments are not limited thereto. For example, the substrate 1 may have an edge such as a flat, and/or may have a notch position on the circumference of the circle. Furthermore the substrate 1 may have a diameter of 100 mm, 150 mm, 200 mm, 300 mm, or 450 mm; however, example embodiments are not limited thereto.

In some example embodiments, the first memory device C1 may indicate a memory device formed in a region relatively close to an edge, such as a periphery of the substrate 1, and the second memory device C2 may indicate a memory device formed relatively close to the center of the substrate 1.

Meanwhile, a write characteristic and/or a reference resistor characteristic of a memory device may vary, for example may vary depending on a location on the substrate 1, at which the memory device is formed. For example, in the case where memory devices formed on the substrate 1 include MRAM cells, a size of an MRAM cell may vary depending on a location of a memory device in the substrate 1.

For example, a size of an MRAM cell of the first memory device C1 placed relatively close to the periphery of the substrate 1 may be relatively small due to a fabrication/manufacturing process. In contrast, a size of an MRAM cell of the second memory device C2 placed relatively close to the center of the substrate 1 may be relatively large due to the fabrication/manufacturing process. According to some example embodiments of inventive concepts, a level of a write voltage, such as a level of an improved or optimal write voltage for a memory device, (or a chip) may be determined in consideration of a relative location of the memory device in the substrate 1. For example, a level of a write voltage may be determined based on a radial position and/or an angular position and/or a number of neighboring devices of the memory device in the substrate 1. Accordingly, a memory device with improved reliability and endurance may be provided, as described more fully described below.

Figure 2:
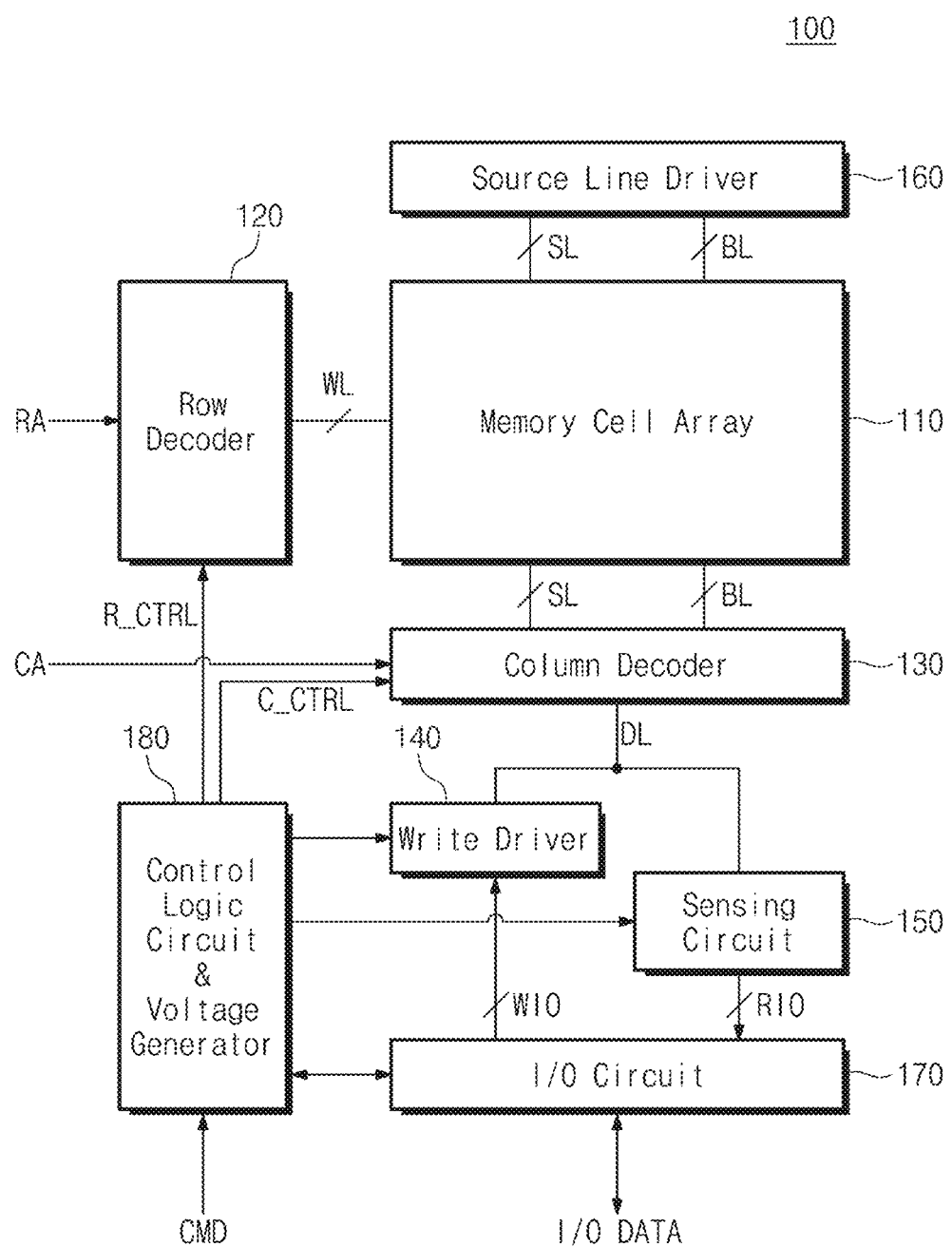
FIG. 2 illustrates a configuration of a memory device of FIG. 1.

FIG. 2 illustrates a configuration of the memory devices C1 and C2 of FIG. 1. In some example embodiments, a memory device 100 of FIG. 2 may be an example of implementing the memory devices C1 and C2 of FIG. 1. The memory device 100 may include a memory cell array 110, a row decoder 120, a column decoder 130, a write driver 140, a sensing circuit 150, a source line driver 160, an input/output circuit 170, and a control logic circuit and voltage generator 180.

The memory cell array 110 may include a plurality of memory cells each configured to store data. For example, each memory cell may include a variable resistance element, and a value of data stored in the variable resistance element may be determined based on a resistance value of the variable resistance element. For example, each memory cell may include at least one of an MRAM (Magneto-resistive RAM) cell, an STT-MRAM (Spin Transfer Torque MRAM) cell, a PRAM (Phase-change RAM) cell, an ReRAM (Resistive RAM) cell, or the like. In the specification below, the description will be given under the assumption that each memory cell includes an MRAM cell; however, example embodiments are not limited thereto.

The memory cells constituting/included in the memory cell array 110 may be connected with source lines SL, bit lines BL, and word lines WL. For example, memory cells arranged along a row may be connected in common to a word line corresponding to the row, and memory cells arranged along a column may be connected in common to a source line and to a bit line corresponding to the column.

The row decoder 120 may select (or drive) the word line WL connected with a memory cell targeted for a read operation or a write operation. The row decoder 120 may drive the specific word line WL based on a row address RA and a row control signal R_CTRL. The row decoder 120 may provide the selected word line with a driving voltage received from the control logic circuit and from the voltage generator 180.

The column decoder 130 may select the bit line BL and/or the source line SL connected with the memory cell targeted for the read operation or the write operation, based on a column address CA and a column control signal C_CTRL.

In the write operation, the write driver 140 may drive a write voltage and/or a write current for storing write data in a memory cell selected by the row decoder 120 and the column decoder 130. For example, in the write operation of the memory device 100, the write driver 140 may store the write data in the selected memory cell by controlling a voltage of a data line DL based on the write data provided from the input/output circuit 170 through a write input/output line WIO.

Meanwhile, the data line DL is illustrated for convenience of description and brevity of drawing, but the data line DL may be understood as corresponding to the bit line BL and the source line SL selected by the column decoder 130.

In a read operation, the sensing circuit 150 may sense a signal output through the data line DL to determine a value of data stored in the selected memory cell. The sensing circuit 150 may be connected with the column decoder 130 through the data line DL and may be connected with the input/output circuit 170 through a read input/output line RIO. The sensing circuit 150 may output the sensed read data to the input/output circuit 170 through the read input/output line RIO.

The source line driver 160 may drive the source line SL to a specific voltage level under control of the control logic circuit and voltage generator 180. For example, the source line driver 160 may be provided with a voltage for driving the source line SL from the control logic circuit and voltage generator 180. For example, a value of a voltage applied from the source line driver 160 to the source line SL may be variable in a case of performing the write operation such that a memory cell has a large resistance value (e.g., an anti-parallel state) or in the case of performing the write operation such that a memory cell has a small resistance value (e.g., a parallel state).

Meanwhile, although not illustrated in FIG. 2, the memory device 100 may further include other memory such as a fuse array and/or an anti-fuse array. The fuse array may be arranged along rows and columns and may include fuses that are blown, for example, with a laser. The anti-fuse array may include anti-fuses arranged along rows and columns. For example, a fuse array or an anti-fuse that is a one-time programmable (OTP) memory may be nonvolatile. Information about the memory device 100 may be written in the anti-fuse array. For example, information about the manufacturing process, the specific lot and/or the specific substrate 1, a specific location of the memory device 100 within the substrate 1, information about a fail address of the memory cell array 110, information about internal voltages (e.g., a write voltage and/or a read voltage) of the memory device 100, and the like may be written in the anti-fuse array. In particular, according to some example embodiments of inventive concepts, information about a value of a write voltage such as an optimal write voltage determined in the process of testing the memory device 100 after fabrication of the memory device 100 may be written in the anti-fuse array.

Figure 3:
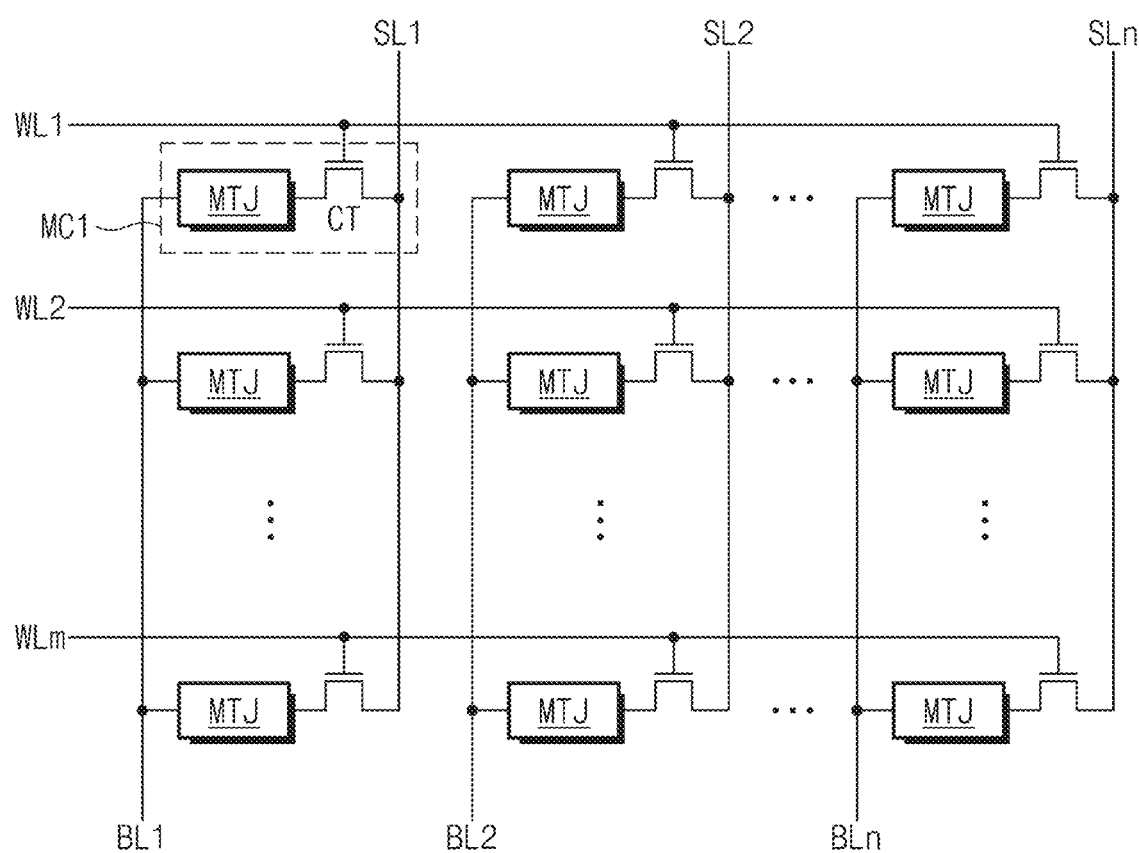
FIG. 3 is a circuit diagram illustrating a configuration of a memory cell array of FIG. 2.

FIG. 3 is a circuit diagram illustrating a configuration of the memory cell array 110 of FIG. 2. A memory cell array 110a may include a plurality of memory cells arranged in row and column directions. Each memory cell may include a magnetic tunnel junction (MTJ) element and a cell transistor CT. As an example, each memory cell may be a 1T1MTJ memory cell; however, example embodiments are not limited thereto. As the MTJ element of each memory cell is written to have a specific resistance value, data corresponding to the specific resistance value may be stored in each memory cell. In some example embodiments, a memory cell indicated by a dotted box from among the plurality of memory cells is marked by "MC1".

The plurality of memory cells may be connected with word lines WL1 to WLm, bit lines BL1 to BLn, and source lines SL1 to SLn. In the first memory cell MC1, a first end of the MTJ element may be connected or directly connected with the first bit line BL1, and a second end of the MTJ element may be connected or directly connected with a first end of the cell transistor CT. The MTJ element may be arranged in series between the cell transistor CT and the bit line BL. A second end of the cell transistor CT may be connected with the source line SL1, and a gate electrode of the cell transistor CT may be connected with the first word line WL1.

Figure 4:
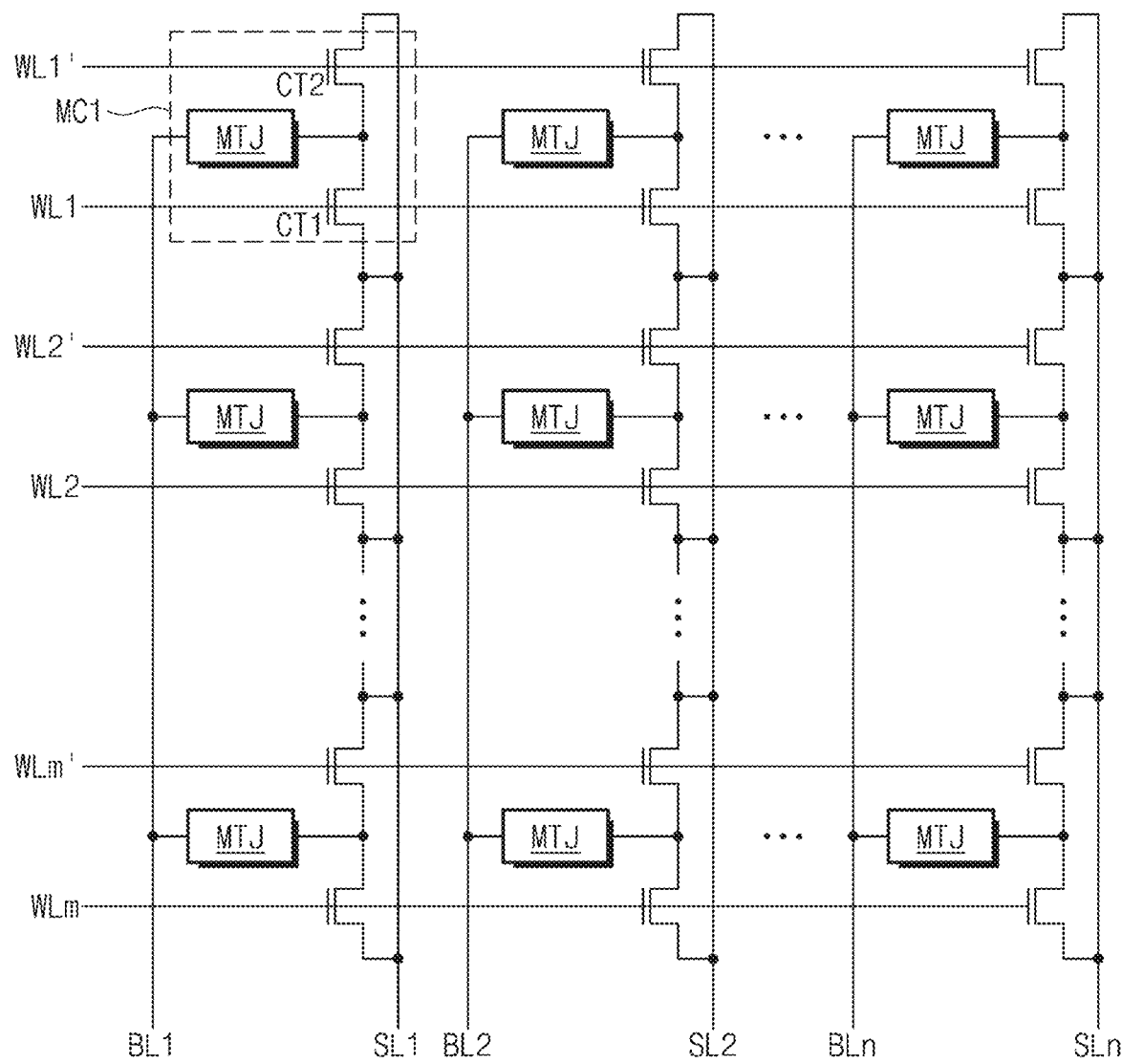
FIG. 4 is a circuit diagram illustrating a configuration of a memory cell array of FIG. 2.

FIG. 4 is a circuit diagram illustrating a configuration of the memory cell array 110 of FIG. 2. A memory cell array 110b may include a plurality of memory cells arranged in row and column directions. Each memory cell may include an MTJ element and two cell transistors. For example, the memory cell may be a 2T1MTJ memory cell. Some example embodiments illustrated in FIG. 4 as a first memory cell MC1 indicated by a dotted box from among the plurality of memory cells includes an MTJ element, a first cell transistor CT1, and a second cell transistor CT2.

The first memory cell MC1 may have a structure in which the two cell transistors CT1 and CT2 share one MTJ element. In the first memory cell MC1, a first end of the MTJ element may be connected, e.g. directly connected in series, with the first bit line BL1, and a second end of the MTJ element may be connected, e.g. directly connected in series, with first ends of the first and second cell transistors CT1 and CT2. Second ends of the cell transistors CT1 and CT2 may be connected or directly connected to the first source line SL1. A gate electrode of the first cell transistor CT1 may be connected or directly connected with the first word line WL1, and a gate electrode of the second cell transistor CT2 may be connected with a first sub word line WL1'. Each of the cell transistors CT1 and CT2 may be switched on or switched off by a signal (or a voltage) provided through the first word line WL1 or the first sub word line WL1'.

Example embodiments are not limited to those illustrated in FIGS. 3 and 4, nor are the features of FIGS. 3 and 4 meant to be mutually exclusive. For example, a memory device 100 may include a first memory cell array 110 as described with reference to FIG. 3, and a second memory cell array 110b as described in FIG. 4.

Figure 5:
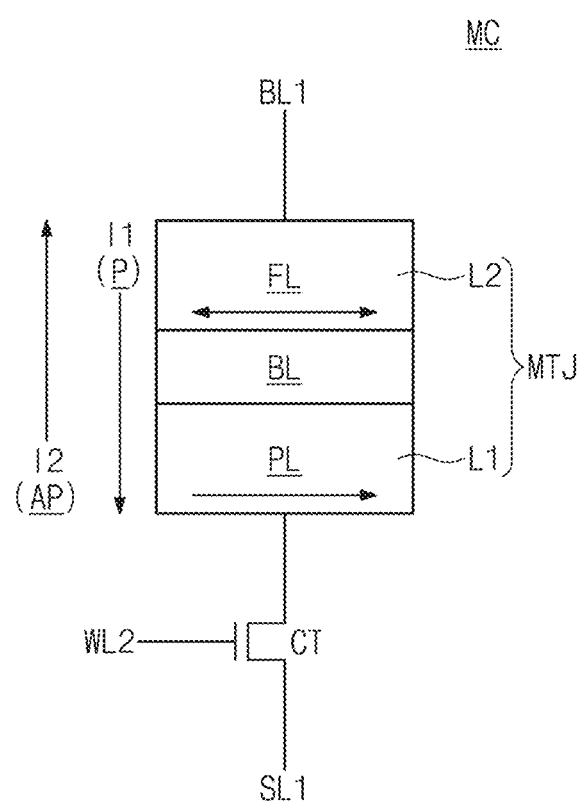
FIGS. 5 and 6 illustrate a configuration of a memory cell of FIG. 3.
Figure 6:
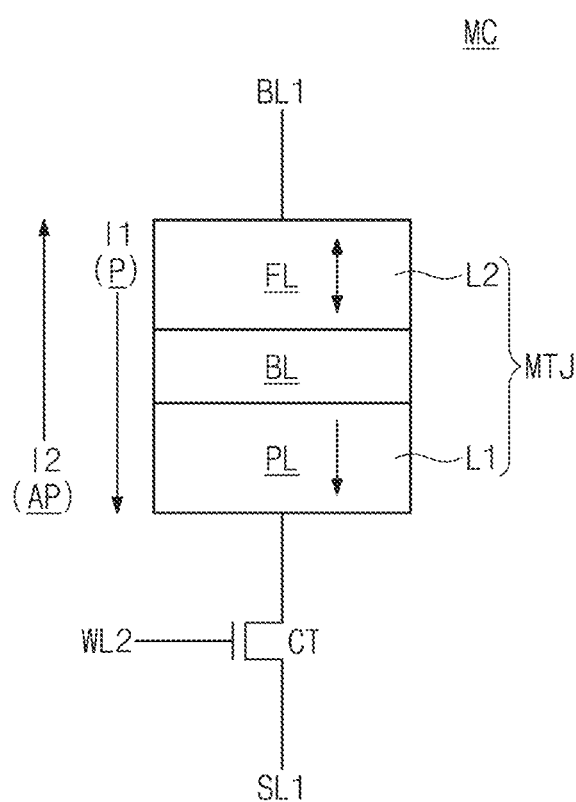

FIGS. 5 and 6 illustrate configurations of a memory cell of FIG. 3.

Referring to FIGS. 5 and 6, an MTJ element may include a first magnetic layer L1, a second magnetic layer L2, and a barrier layer BL (or a tunneling layer) interposed between the first magnetic layer L1 and the second magnetic layer L2. The barrier layer BL may consist of or include at least one of magnesium (Mg) oxide, titanium (terminal) oxide, aluminum (Al) oxide, magnesium-zinc (Mg—Zn) oxide, or magnesium-boron (Mg—B) oxide, or a combination thereof. Each of the first magnetic layer L1 and the second magnetic layer L2 may include at least one magnetic layer.

In detail, the first magnetic layer L1 may include a reference layer (e.g., a pinned layer PL) having a magnetization direction fixed (e.g. pinned) in a specific direction, and the second magnetic layer L2 may include a free layer FL having a magnetization direction that is changeable to be parallel or anti-parallel to the magnetization direction of the reference layer. However, FIGS. 5 and 6 disclose, by example, the case where the first magnetic layer L1 includes the reference layer PL and the second magnetic layer L2 includes the free layer FL, but example embodiments are not limited thereto. For example, unlike the embodiment illustrated in FIGS. 5 and 6, the first magnetic layer L1 may include a free layer, and the second magnetic layer L2 may include a pinned layer.

In some example embodiments, as illustrated in FIG. 5, magnetization directions may be mostly parallel to an interface of the barrier layer BL and the first magnetic layer L1. In this case, each of the reference layer PL and the free layer FL may consist of or include a ferromagnetic material, and may include the same, or different, materials. For example, the reference layer PL may further include an anti-ferromagnetic material for pinning a magnetization direction of the ferromagnetic material.

In some example embodiments, as illustrated in FIG. 6, magnetization directions may be mostly perpendicular to an interface of the barrier layer BL and the first magnetic layer L1. In this case, each of the reference layer PL and the free layer FL may consist of or include at least one of perpendicular magnetic materials (e.g., CoFeTb, CoFeGd, or CoFeDy), perpendicular magnetic materials with an L10 structure, CoPt-based materials with a hexagonal-close-packed-lattice structure, and perpendicular magnetic structures, or a combination thereof. The perpendicular magnetic material with the L10 structure may include at least one of FePt with the L10 structure, FePd with the L10 structure, CoPd with the L10 structure, or CoPt with the L10 structure, or a combination thereof. The perpendicular magnetic structure may include magnetic layers and non-magnetic layers that are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where n is the number of stacked pairs of layers, or a combination thereof. Here, a thickness of the reference layer PL may be greater than a thickness of the free layer FL, or a coercive force of the reference layer PL may be greater than a coercive force of the free layer FL.

In some example embodiments, when a voltage of a relatively high level is applied to the bit line BL1 and a voltage of a relatively low level is applied to the source line SL1, a write current I1 may flow. In this case, a magnetization direction of the second magnetic layer L2 may be identical to a magnetization direction of the first magnetic layer L1, and the MTJ element may have a low resistance value (i.e., a parallel state).

In contrast, when a voltage of a relatively high level is applied to the source line SL1 and a voltage of a relatively low level is applied to the bit line BL1, a write current I2 may flow. In this case, a magnetization direction of the second magnetic layer L2 may be opposite to a magnetization direction of the first magnetic layer L1, and the MTJ element may have a great resistance value (i.e., an anti-parallel state).

In some example embodiments, in the case where the MTJ element is in the parallel state, the memory cell MC may be regarded as storing data of a first value (e.g., a logic "0"). In contrast, in the case where the MTJ element is in the anti-parallel state, the memory cell MC may be regarded as storing data of a second value (e.g., a logic "1").

Meanwhile, only one cell transistor CT is illustrated in FIGS. 5 and 6, but the components illustrated in FIGS. 5 and 6 may also be applied to the memory cell of FIG. 4. In this case, the cell transistors CT1 and CT2 may be connected with one end of the MTJ element. A basic principle, an operation, and/or the like of the MTJ element may be identically applied to the memory cell of FIG. 4 except that a current path changes depending on a cell transistor turned on from among the cell transistors CT1 and CT2.

Example embodiments are not limited to those illustrated in FIGS. 5 and 6, nor are the features of FIGS. 5 and 6 necessarily meant to be mutually exclusive. For example, a memory device 100 may include a first memory cell MC with reference to FIG. 5, and a second memory cell MC as described in FIG. 6.

Figure 7:
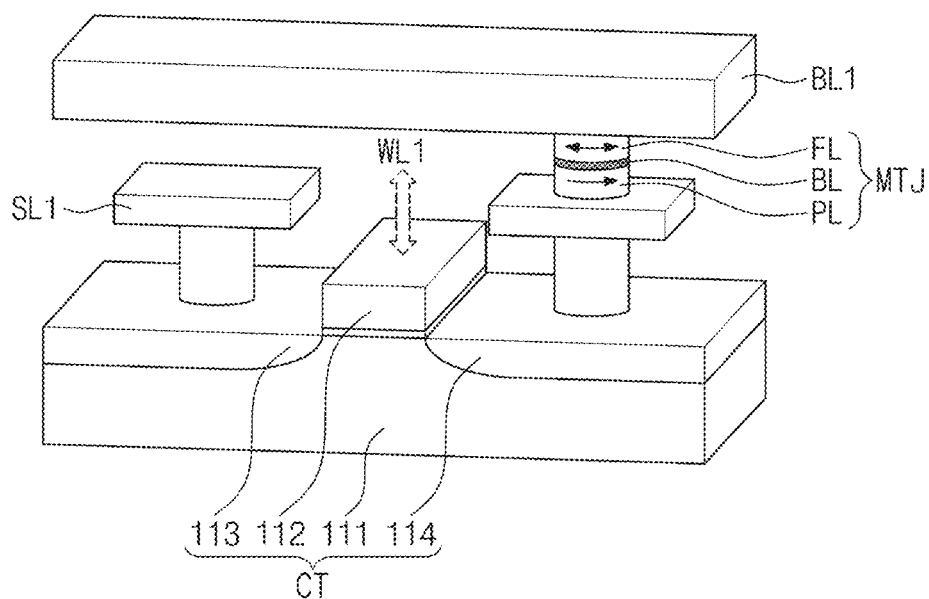
FIG. 7 is a conceptual diagram illustrating a configuration associated with a memory cell of FIG. 4.

FIG. 7 is a conceptual diagram illustrating a configuration associated with a memory cell of FIG. 4.

The cell transistor CT may include a body substrate 111, a gate electrode 112, and junctions 113 and 114. The junction 113 may be formed on the body substrate 111 and may be connected with the source line SL1. The junction 114 may be formed on the body substrate 111 and may be connected with the bit line BL1 through the MTJ element. The gate electrode 112 may be formed on the body substrate 111 between the junctions 113 and 114 and may be connected with the word line WL1. Meanwhile, the configuration of FIG. 7 is exemplary. Like example embodiments described with reference to FIG. 4, in the case where two cell transistors share one MTJ element, a modified version of the configuration illustrated in FIG. 7 may be adopted. Furthermore although FIG. 7 illustrates a case of a planar cell transistor CT, example embodiments are not limited to planar transistors.

Figure 8:
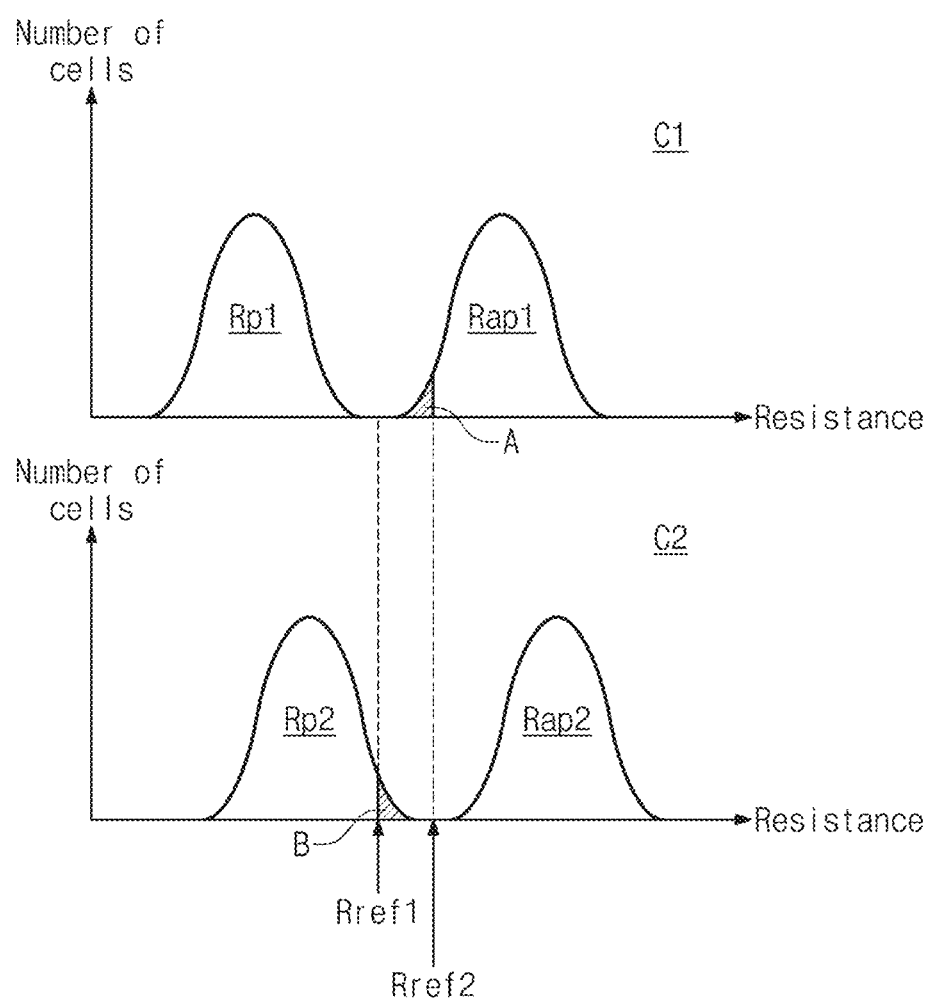
FIG. 8 illustrates a graph associated with a write state of a memory cell of FIG. 5 or 6.

FIG. 8 illustrates a graph associated with a write state of a memory cell of FIG. 5 or 6.

As mentioned above with reference to FIG. 1, a write characteristic of a memory device may vary depending on a location on the substrate 1, at which the memory device is formed. For example, a resistance distribution diagram corresponding to the first memory device C1 may be different from a resistance distribution diagram corresponding to the second memory device C2. For example, a resistance value that the first memory device C1 has may be mostly smaller than a resistance value that the second memory device C2 has. A reason for the difference may be that a size of an MRAM cell belonging to the first memory device C1 is mostly smaller than a size of an MRAM cell belonging to the second memory device C2.

First, referring to the graph corresponding to the first memory device C1, a resistance distribution Rpt of memory cells written to the parallel state and a resistance distribution Rap1 of memory cells written to the anti-parallel state may be distinguished by a value of a first reference resistor Rref1. For example, the first reference resistor Rref1 may be used as a reference for determining a data value stored in an MRAM cell. For example, a memory cell having a resistance value smaller than the first reference resistor Rref1 may be regarded as storing a first value, and a memory cell having a resistance value greater than the first reference resistor Rref1 may be regarded as storing a second value.

Next, referring to the graph corresponding to the second memory device C2, a resistance distribution Rp2 of memory cells written to the parallel state and a resistance distribution Rap2 of memory cells written to the anti-parallel state may be distinguished by a value of a second reference resistor Rref2. For example, the second reference resistor Rref2 may be used as a reference for determining a data value stored in an MRAM cell. For example, a memory cell having a resistance value smaller than the second reference resistor Rref2 may be regarded as storing the first value, and a memory cell having a resistance value greater than the second reference resistor Rref2 may be regarded as storing the second value.

According to the above, when the same write condition is applied to the memory devices C1 and C2 provided from the same substrate 1, an error may occur in the write operation. For example, assuming that the write operation is performed under the condition that the second reference resistor Rref2 is applied to the first memory device C1, memory cells written to have a resistance value of the anti-parallel state Rap1, in detail, memory cells belonging to region "A" of FIG. 8 may be regarded as having the parallel state Rpt, not an intended anti-parallel state. In contrast, assuming that the write operation is performed under the condition that the first reference resistor Rref1 is applied to the second memory device C2, memory cells written to have a resistance value of the parallel state Rp1, in detail, memory cells belonging to region "B" of FIG. 8 may be regarded as having the anti-parallel state Rap2, not an intended parallel state. For example, in the case where the same reference resistor value is applied to all memory devices separated from the same substrate 1, an unintended write error may occur.

Figure 9:
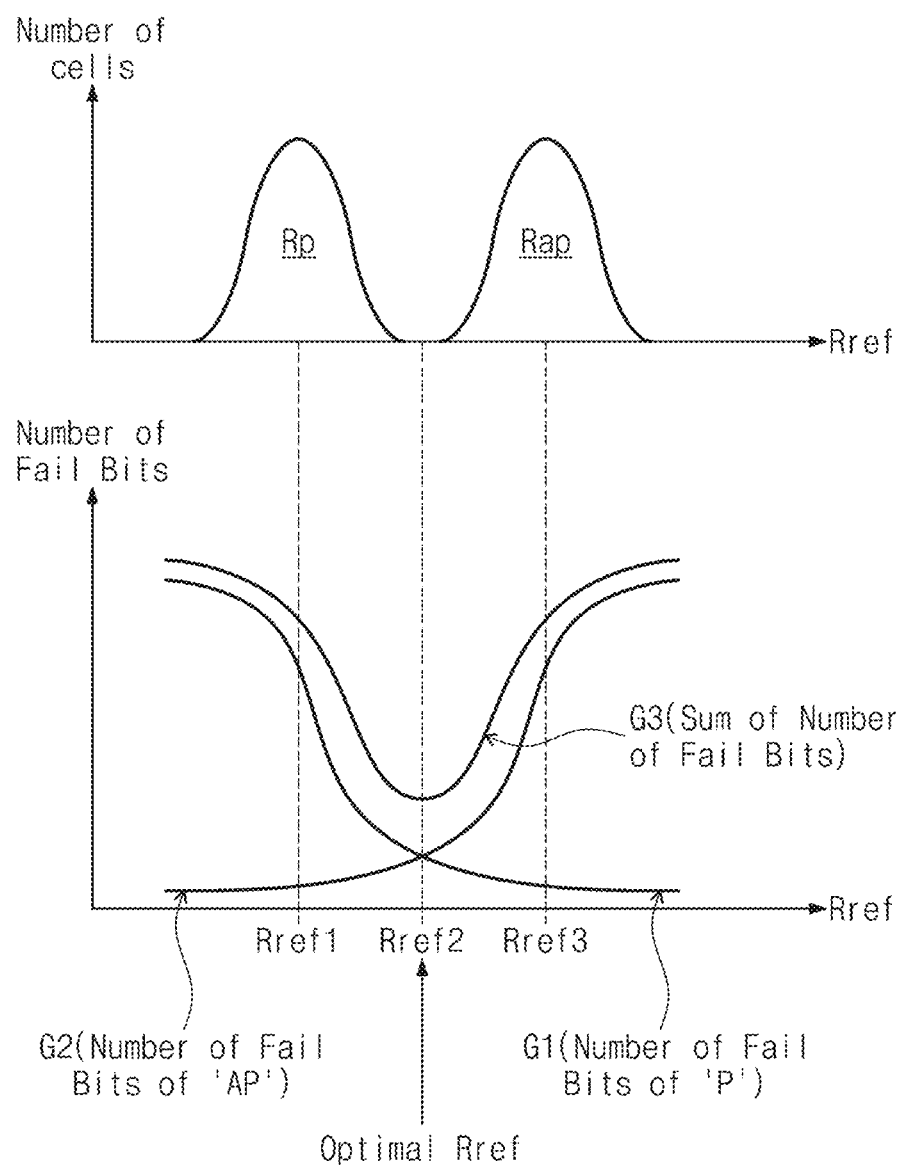
FIG. 9 conceptually illustrates how to determine a value of an optimal reference resistor for a memory device, according to some example embodiments of inventive concepts.

FIG. 9 conceptually illustrates how to determine a value of an improved, e.g. an optimal reference resistor for a memory device, according to some example embodiments of inventive concepts.

Referring to FIG. 9, in a test operation for a memory device, a pre-write operation may be performed on the memory device. Here, the pre-write operation may mean or correspond to a write operation for searching for an optimal reference resistor for distinguishing the parallel state and the anti-parallel state in the process of testing a memory device, not for storing data. For example, a write voltage that is applied to the memory device in the pre-write operation may be greater in level than a write voltage that is used in a normal write operation after the product shipping. This may be associated with preventing or reducing a likelihood of a write fail for the purpose of accurately performing the test operation.

First, either all of, or a subset of, memory cells of the memory device may be written to the parallel state by using a test device (e.g., automatic test equipment (ATE)). The test device may test memory devices on the substrate 1; alternatively, the test device may test the memory devices after the memory devices have been diced and packaged. Referring to FIG. 9, "Rp" indicates a distribution of resistance values of memory cells written to the parallel state. Afterwards, the number of fail bits of the memory device may be counted by using the test device. For example, in the case of counting fail bits by using a reference resistor (e.g., the first reference resistor Rref1) of a relatively small value, memory cells having resistance values greater than the first reference resistor Rref1 may be processed as a write fail. For this reason, the number of fail bits may be very great. As a value of the reference resistor becomes greater, the number of fail bits of the memory device may decrease. A graph indicated by G1 shows the tendency of the number of counted fail bits.

Either all of, or a subset of, the memory cells of the memory device may be written to the anti-parallel state by using the test device. In FIG. 9, "Rap" indicates a distribution of resistance values of memory cells written to the anti-parallel state. Afterwards, the number of fail bits of the memory device may be counted by using the test device. For example, in the case of counting fail bits by using a reference resistor (e.g., the first reference resistor Rref1) of a relatively small value, the number of fail bits may be very small. However, as a value of the reference resistor becomes greater (e.g., increases to a point between a value of the second reference resistor Rref2 and a value of a third reference resistor Rref3), the number of fail bits of the memory device may increase. A graph indicated by G2 shows the tendency of the number of counted fail bits.

Afterwards, the test device may determine a value of an improved, or an optimal reference resistor, by using the number of counted fail bits. For example, the test device may sum the graph G1 indicating the number of fail bits measured in the parallel state and the graph G2 indicating the number of fail bits measured in the anti-parallel state. A graph indicated by G3 may be drawn as a sum result. In the graph indicated by G3, a value of a reference resistor (i.e., Rref2) corresponding to a low, e.g. the smallest number or very near the smallest number, of fail bits may be a value of an optimal reference resistor of the memory device.

Afterwards, the test device may decide a value of an improved, e.g. an optimal, write voltage for the memory device, based on the value of the best reference resistor (e.g., Rref2). A value of the write voltage may be drawn from the tendency of a size of an MRAM cell measured in advance, a reference resistor value according to the size of the MRAM cell, and a value of a write voltage according to the reference resistor value.

In some example embodiments, the case where a value of an improved/optimal reference resistor is relatively small (e.g., Rref1) may correspond to or indicate that a size of an MRAM cell of the memory device is relatively large, which may indicate that a relatively great write voltage value is required. In contrast, the case where a value of an improved/optimal reference resistor is relatively great (e.g., Rref3) may correspond to or indicate that a size of an MRAM cell of the memory device is relatively small, which may mean that a relatively small write voltage value is required.

Assuming that the above interoperations are applied to the first memory device C1 and the second memory device C2 of FIG. 1, there may be drawn that a value of an improved/optimal reference resistor of the first memory device C1 is relatively great (e.g., Rref3) and thus a relatively small write voltage is used or required in the write operation of the first memory device C1. As in the above description, there may be drawn that a value of an improved/optimal reference resistor of the second memory device C2 is relatively small (e.g., Rref1) and thus a relatively great write voltage is used or required in the write operation of the second memory device C2.

Finally, the test device may store the measured reference resistor value and a value of a write voltage corresponding thereto in the memory device. After the memory device is used by an end user, a value of an improved/optimal write voltage stored in the memory device may be used in the normal write operation. According to some example embodiments, a value of an improved/optimal reference resistor and a value of a write voltage corresponding thereto may be determined by performing only two pre-write operations on the memory device, and thus, a time and/or costs necessary to perform a test operation for deciding the write voltage value may decrease. Alternatively or additionally, as a value of an improved/optimal write voltage (or current) is selected depending on a location on the substrate 1, at which the memory device is formed, after the product shipping, the reliability of the memory device in the write operation may be improved, and/or the endurance of the memory device may be improved.

Figure 10:
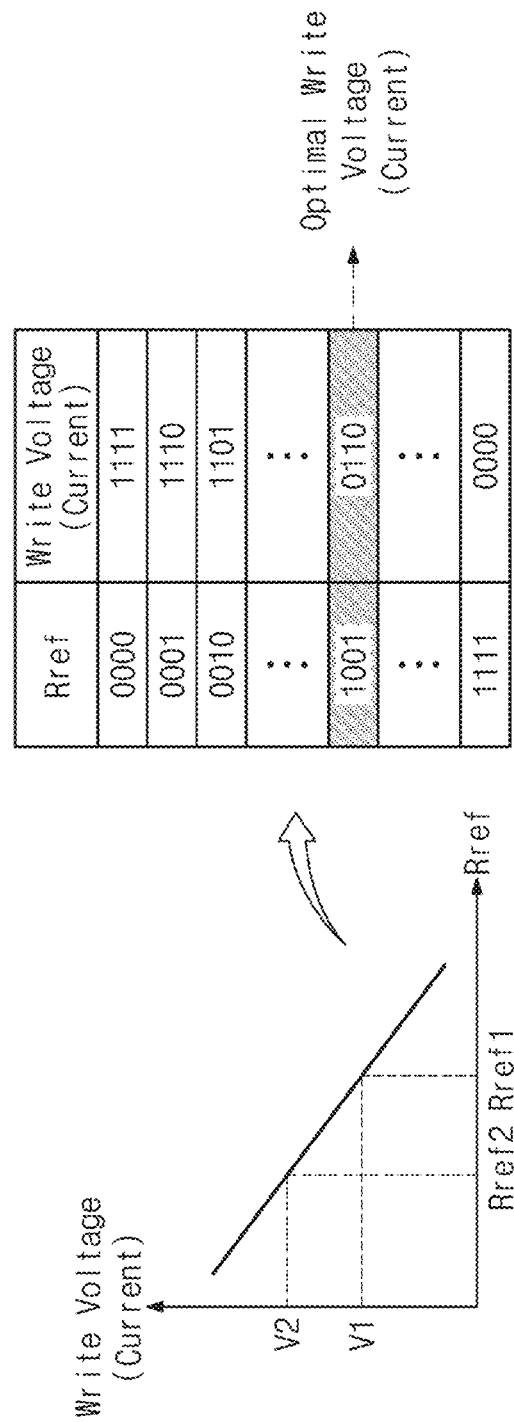
FIG. 10 conceptually illustrates a relationship between a value of an optimal reference resistor determined in a test operation for a memory device and a value of an optimal write voltage corresponding thereto.

FIG. 10 conceptually illustrates a relationship between a value of an improved/optimal reference resistor determined in a test operation for a memory device and a value of an improved/optimal write voltage corresponding thereto.

In some example embodiments, a value of a reference resistor of a memory device may be inversely proportional to a value of an improved/optimal write voltage (or current) of the memory device, which corresponds to the reference resistor value. However, the reference resistor value of the memory device may not be accurately inversely proportional to the value of the best write voltage of the memory device. It should be understood that a value of a write voltage may decrease as a value of a reference resistor increases.

A graph of FIG. 10 conceptually shows that the first reference resistor Rref1 of a relatively great value corresponds to the first memory device C1 formed relatively close to the periphery of the substrate 1 of FIG. 1 and a value of an improved/optimal write voltage corresponding thereto is "V1" being relatively small. The reason is that a write voltage of a relatively small value is required due to a relatively small size of an MRAM cell of the first memory device C1.

In contrast, the graph of FIG. 10 conceptually shows that the second reference resistor Rref2 of a relatively small value corresponds to the second memory device C2 formed relatively close to the center of the substrate 1 of FIG. 1 and a value of an improved/optimal write voltage corresponding thereto is "V2" being relatively great. The reason may be that a write voltage of a relatively great value is required due to a relatively large size of an MRAM cell of the second memory device C2.

Meanwhile, a relationship between the value of an improved/best reference resistor and the value of the write voltage of the memory device may be managed in the form of a table. In some example embodiments, a value of a reference resistor and a value of a write voltage (or current) may be expressed by 4 bits, but example embodiments are not limited thereto. In the case where a value of a reference resistor is expressed by 4 bits, the fail bit counting operation described with reference to FIG. 9 may be performed as much as 16 times or less for each of the fail bit counting operation for the parallel state and the fail bit counting operation for the anti-parallel state. For example, a write voltage (or current) may be variable between a first value corresponding to "1111" and a second value corresponding to "0000".

A value (e.g., "1001") of an improved/optimal reference resistor and a value (e.g., "0110") of a write voltage corresponding thereto may be stored in the memory device in the process of testing the memory device. Alternatively or additionally, the table illustrated in FIG. 10 may be stored in the memory device. In this case, a value (e.g., "1001") of an improved/optimal reference resistor and a value (e.g., "0110") of a write voltage corresponding to the memory device may be directed in the write operation when the memory device is used by the end user. For example, a value of an improved/optimal reference resistor, a value of a write voltage corresponding thereto, and/or the table may be stored in an anti-fuse array or the like of the memory device, but the present disclosure is not limited thereto.

Figure 11:
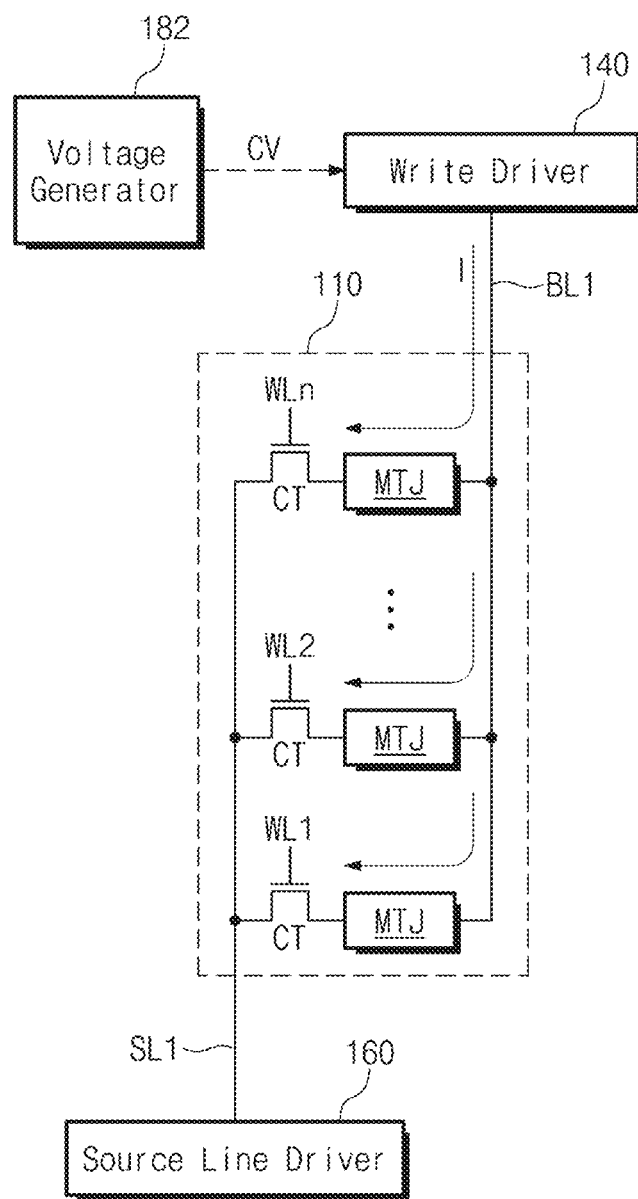
FIG. 11 conceptually illustrates how a memory device is tested, according to some example embodiments of inventive concepts.

FIG. 11 conceptually illustrates how a memory device is tested, according to some example embodiments of inventive concepts. In detail, FIG. 11 may be associated with a pre-write operation of a memory device, which is performed in the process of testing the memory device.

The memory cell array 110 may include a plurality of memory cells each including an MTJ element and a cell transistor. The write driver 140, the source line driver 160, and a voltage generator 182 are illustrated together with the memory cell array 110. For example, the voltage generator 182 may be a part of the control logic circuit and voltage generator 180 of FIG. 2. Only "n" memory cells connected with the first bit line BL1 and the first source line SL1 are illustrated for convenience of description and brevity of drawing.

First, the voltage generator 182 may be configured to generate a voltage for the pre-write operation to be performed on the memory cell array 110. Here, the expression "voltage for the pre-write operation" may correspond to a voltage, the level of which is high to such an extent as a write fail does not occur at the memory cells. For example, a value of the voltage for the pre-write operation may be greater than a value of a write voltage that is used in a normal (or general) write operation capable of being performed by the end user, but example embodiments are not limited thereto. For example, a value of the voltage for performing the pre-write operation may be implemented by a code value CV for turning on/off respective elements (e.g., respective transistors) constituting the write driver 140.

The write driver 140 may perform the pre-write operation for memory cells based on the code value CV. The pre-write operation may include writing the memory cells to the parallel state and writing the memory cells to the anti-parallel state. For example, the write driver 140 may output a write current "I" corresponding to the code value CV. For example, the write driver 140 may include a driver circuit configured to generate the write current "I" for the purpose of performing the pre-write operation on the memory cells.

Figure 12:
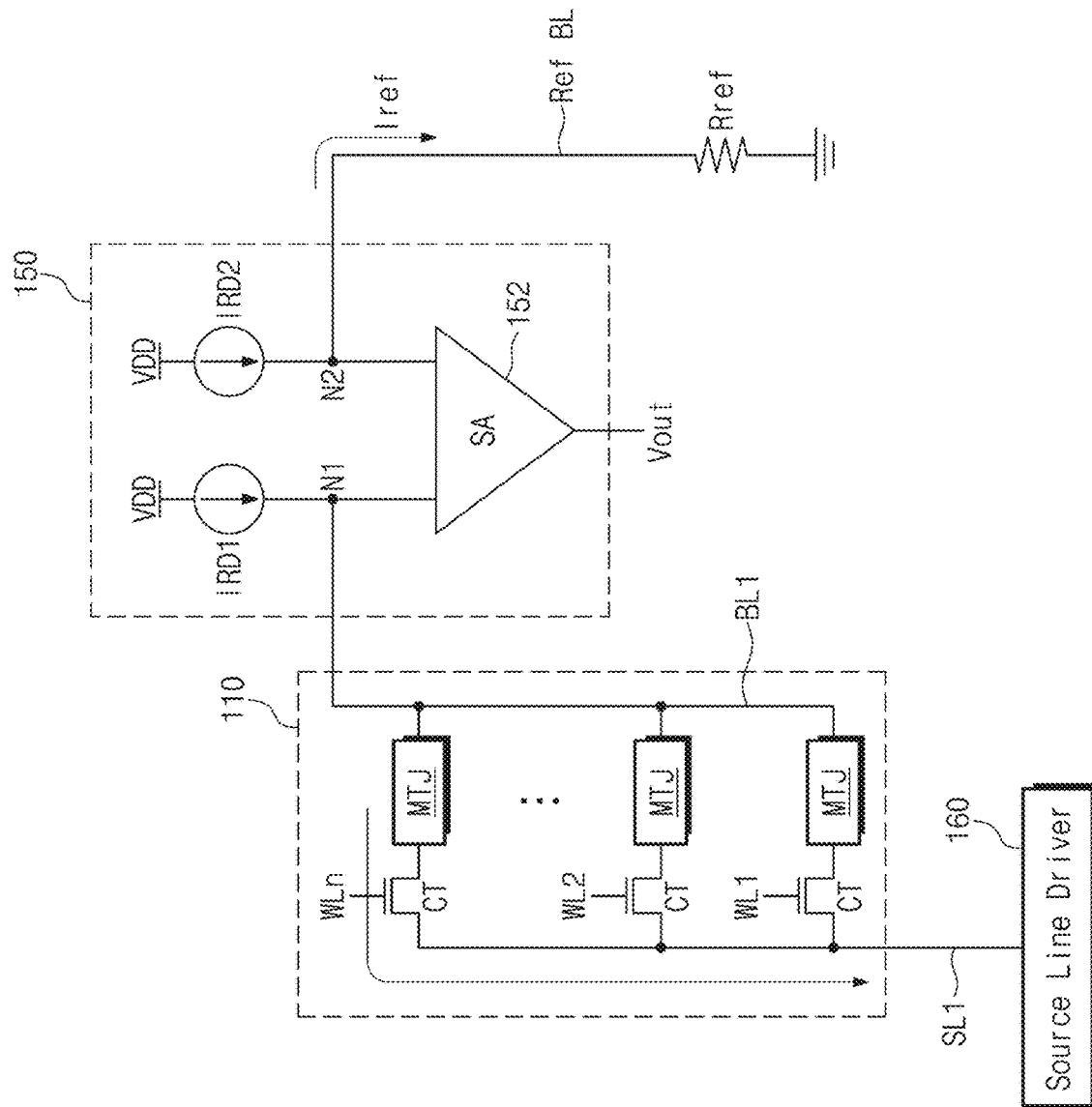
FIG. 12 conceptually illustrates how to perform a test operation on a memory device, according to some example embodiments of inventive concepts.

FIG. 12 conceptually illustrates how to perform a test operation on a memory device, according to some example embodiments of inventive concepts. In detail, the embodiment of FIG. 12 may be associated with determining a value of an improved/optimal reference resistor, which is performed in the process of testing a memory device. For example, a test operation to be described with reference to FIG. 12 may be performed after the test operation described with reference to FIG. 11, and for convenience of description, it is assumed that the memory cells of FIG. 12 are written to the parallel state.

The memory cell array 110 may include a plurality of memory cells connected with a plurality of bit lines and a plurality of source lines. Each memory cell may include an MTJ element and at least one cell transistor. Only memory cells connected with the first bit line BL1 and the first source line SL1 are illustrated for brevity of drawing. The first bit line BL1 may be connected with a first node N1, and the first source line SL1 may be connected with the source line driver 160.

The reference resistor Rref may be associated with a reference voltage Vref used/necessary to read data stored in a memory cell of the memory cell array 110. For example, the reference resistor Rref may be implemented with gate polysilicon, e.g. with a serpentine gate polysilicon, used in forming a gate electrode of a transistor (e.g., the cell transistor CT) in the process of fabricating/manufacturing the memory device 100. In this case, a value of the reference resistor Rref may be easily changed by adjusting a length, a dopant concentration, and/or the like of the implemented gate polysilicon, and thus, as described with reference to FIGS. 9 and 10, fail bits according to the value of the reference resistor Rref may be counted.

The sensing circuit 150 may be configured to read data stored in a memory cell connected with the first bit line BL1. For example, the sensing circuit 150 may include current sources generating a first read current IRD1 and a second read current IRD2, and a sense amplifier 152.

The first read current IRD1 may be used to sense a voltage drop in the selected memory cell of the first bit line BL1. For example, the first read current IRD1 may be input to a word line (i.e., WL2) of the selected memory cell connected with/to the first bit line BL1. As a result, a voltage drop may occur at the MTJ element connected with/to the second word line WL2.

The second read current IRD2 may be used to determine a voltage drop in the reference resistor Rref connected with a second node N2 through a reference bit line Rref BL. For example, the second read current IRD2 may flow through the reference resistor Rref, and thus, a voltage drop may occur at the reference resistor Rref. A reference current Tref is illustrated in FIG. 12 to show a current flowing through the reference resistor Rref, but the reference current Tref may be regarded as substantially identical to the second read current IRD2.

The sense amplifier 152 may sense a voltage difference between the first node N1 and the second node N2, and may amplify the sensed voltage difference. For example, a voltage level of the first node N1 may be different from a voltage level of the second node N2. The amplified voltage difference may be output as an output voltage Vout and may be used to determine data read from the memory cell. The sense amplifier 152 may be implemented with cross-coupled inverters; however, example embodiments are not limited thereto.

In some example embodiments, in the process of testing the memory device 100, the number of fail bits of memory cells in at least a portion of the memory cell array 110 may be counted whenever a value of the reference resistor Rref is changed. For example, in the case where at least a portion of the memory cells of the memory cell array 110 are written to have the parallel state, the number of fail bits according to a value of the reference resistor Rref may have the tendency corresponding to the graph G1 of FIG. 9; in the case where the memory cells of the memory cell array 110 are written to have the anti-parallel state, the number of fail bits according to a value of the reference resistor Rref may have the tendency corresponding to the graph G2 of FIG. 9. The test device may obtain (or draw) the graph G3 based on the graphs G1 and G2 of FIG. 9 and/or may determine a value of an improved/optimal reference resistor corresponding to a low, e.g. the smallest number or very near the smallest number, of fail bits and a value of an improved/optimal write voltage corresponding thereto.

Figure 13:
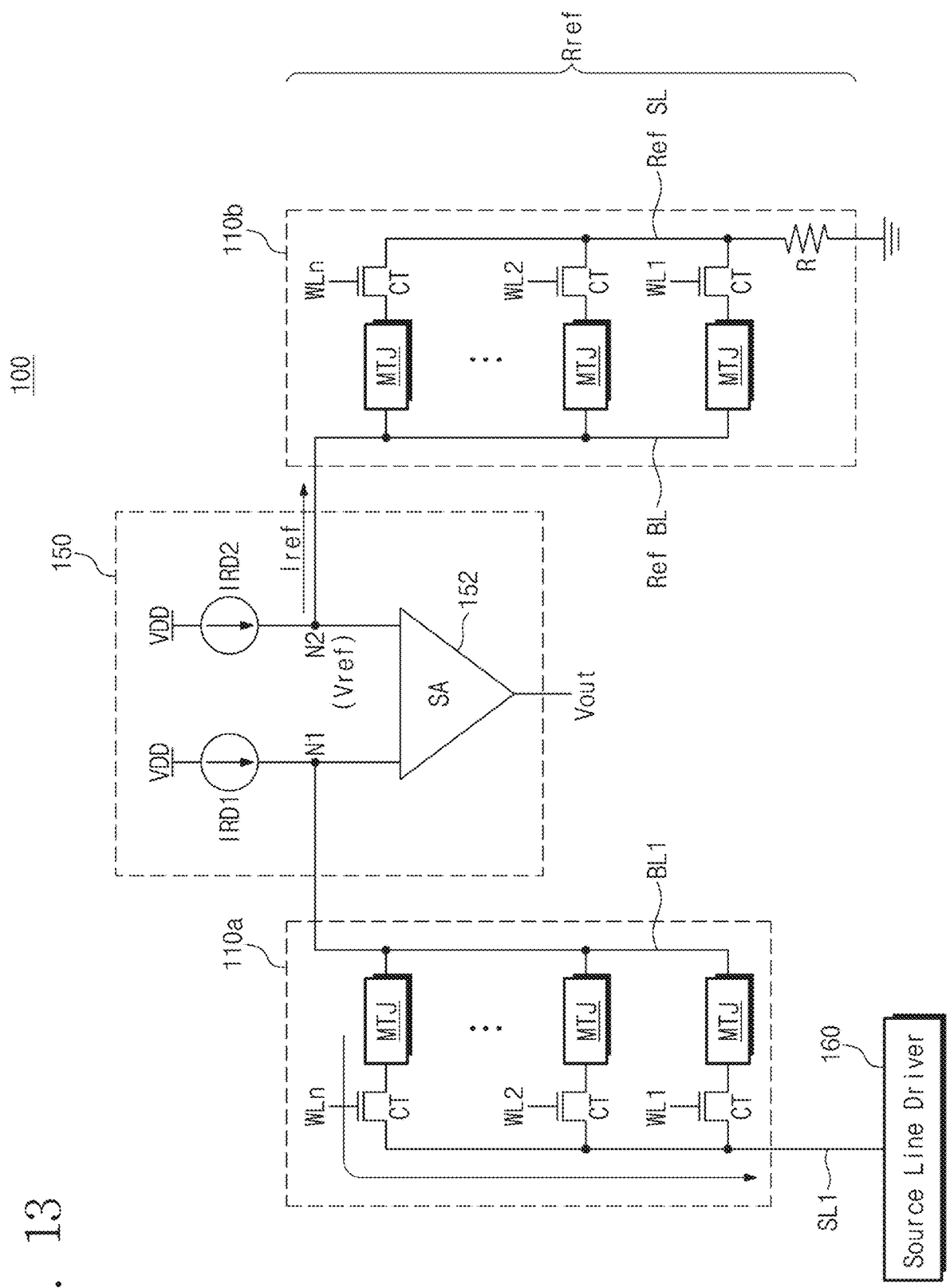
FIG. 13 conceptually illustrates how a memory device is tested, according to some example embodiments of inventive concepts.

FIG. 13 conceptually illustrates how a memory device is tested, according to some example embodiments of inventive concepts. In detail, the embodiment of FIG. 13 may be associated with determining a value of an improved, e.g. an optimal reference resistor, which is performed in the process of testing a memory device. The embodiment of FIG. 13 is mostly similar to the embodiment of FIG. 12.

A memory cell array may include a first region 110a and a second region 110b. The memory cell array may include a plurality of memory cells each including an MTJ element and a cell transistor.

The first region 110a that is a region in which data are stored may include memory cells connected with a plurality of bit lines and a plurality of source lines. However, for brevity of drawing, the memory cells of the first region 110a is illustrated as being connected with the first bit line BL1 and the first source line SL1.

The second region 110b may include components or elements used in/necessary to generate the reference voltage Vref that is used to read data stored in a memory cell of the first region 110a. For example, the second region 110b may include a plurality of memory cells connected with the reference bit line Ref BL and a reference source line Ref SL, and a resistance "R".

In some example embodiments, the memory cells of the first region 110a and the memory cells of the second region 110b may be substantially identical, e.g. identical in structure and in electrical characteristics. The reference bit line Ref BL may be substantially identical in structure to the first bit line BL1, and the reference source line Ref SL may be substantially identical in structure to the first source line SL1. That is, the first region 110a and the second region 110b may be provided by the same manufacturing process. However, depending on example embodiments, the resistance "R" may be provided or may not be provided.

The sensing circuit 150 may be configured to read data stored in a memory cell connected with the first bit line BL1. The sensing circuit 150 may include at least one current source generating the first read current IRD1 and the second read current IRD2, and the sense amplifier 152. The sensing circuit 150 may determine a voltage drop in the selected memory cell of the first bit line BL1 by using the first read current IRD1.

Alternatively or additionally, the sensing circuit 150 may determine a voltage drop in a memory cell connected with the reference bit line Ref BL by using the second read current IRD2. For example, the second read current IRD2 may be input to a memory cell, which is selected as the cell transistor CT is turned on, through the reference bit line Ref BL. Accordingly, a voltage drop in the second region 110b may be regarded as a voltage drop by the reference resistor Rref.

According to some example embodiments, there may be no need or desire to perform fail bit counting in the first region 110a for every reference resistor while the reference resistor Rref is replaced as described with reference to the embodiment of FIG. 12. Instead, fail bits in the first region 110a may be counted while a value of the reference resistor Rref is changed by appropriately controlling the on/off of the cell transistors CT of the second region 110b.

Alternatively or additionally, even though only one reference bit line Ref BL is illustrated in FIG. 13 as connected with the second node N2, more reference bit lines may be connected with the second node N2. For example, a reference bit line that is connected with memory cells having the same structure as the second region 110b illustrated in FIG. 13 may be further connected with the second node N2.

In some example embodiments as described above with reference to FIGS. 12 and 13, a value of an improved/optimal reference resistor may be used to determine a value of an improved/optimal write voltage. The value of the reference resistor and the value of the write voltage thus determined may be stored in a specific region (e.g., an anti-fuse array or other OTP area) of the memory device 100.

Figure 14:
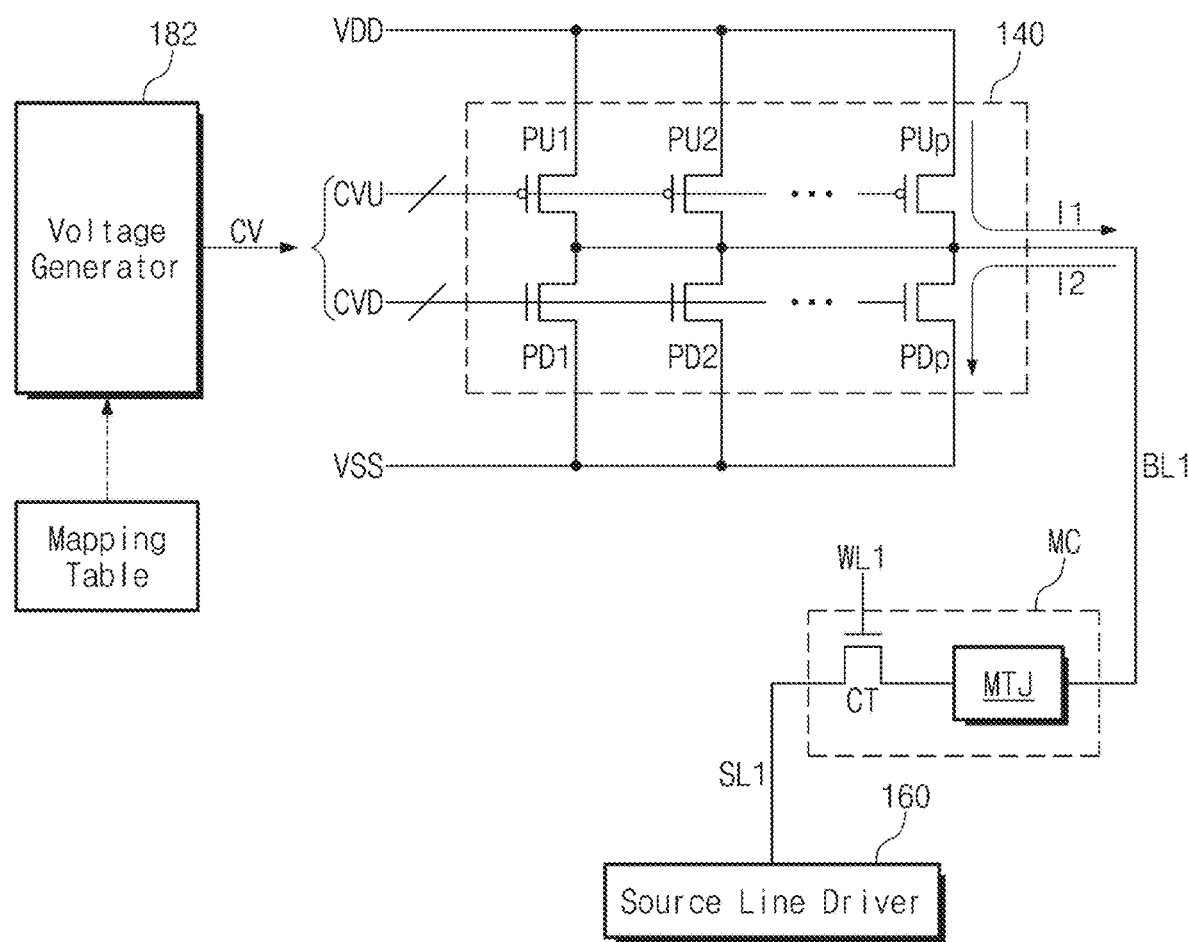
FIG. 14 illustrates a configuration of a driver of FIG. 11.

FIG. 14 illustrates a configuration of a driver of FIG. 11. In detail, some example embodiments of FIG. 14 may be associated with performing a write operation depending on a value of an improved/optimal write voltage determined in the process of testing a memory device.

The driver 140 may include (PMOS) transistors PU1 to PUp and (NMOS) transistors PD1 to PDp. The transistors PU1 to PUp may be connected between the first bit line BL1 and a first power supply voltage VDD. The transistors PD1 to PDp may be connected between the first bit line BL1 and a second power supply voltage VSS. For example, a level of the first power supply voltage VDD may be higher than a level of the second power supply voltage VSS, and a level of a voltage of the source line SL1 may be between the level of the first power supply voltage VDD and the level of the second power supply voltage VSS. For example, the power supply voltages VDD and VSS may be provided from the voltage generator 182 or may be provided from a separate voltage generator.

The driver 140 may be connected with the memory cell MC through the first bit line BL1 selected by the column decoder 130 (refer to FIG. 2). In some example embodiments, additional drivers that are implemented the same as the driver 140 may be respectively provided for respective bit lines different from the first bit line BL1. However, for brevity of drawing, descriptions associated with the additional drivers will be omitted.

The voltage generator 182 may generate the code value CV for controlling the driver 140. The code value CV may be based on a mapping table (e.g., the table described with reference to FIG. 10) in which a value an improved/an optimal reference resistor and a value of an improved/optimal write voltage of a memory device are defined. The code value CV may include a first code value CVU and a second code value CVD. The first code value CVU and the second code value CVD may be implemented with a single code value CV or may be provided independently of each other. An embodiment is illustrated in FIG. 14 as the first code value CVU and the second code value CVD are provided as separate code values.

Each of the transistors PU1 to PUp may be turned on or turned off based on the first code value CVU. For example, in the case where each of the transistors PU1 to PUp is a p-channel metal oxide semiconductor field effect transistor (MOSFET), each of the transistors PU1 to PUp may be turned on in response to a bit of logic "0" and may be turned off in response to a bit of logic "1".

Each of the transistors PD1 to PDp may be turned on or turned off based on the second code value CVD. For example, in the case where each of the transistors PD1 to PDp is an n-channel metal oxide semiconductor field effect transistor (MOSFET), each of the transistors PD1 to PDp may be turned on in response to a bit of logic "1" and may be turned off in response to a bit of logic "0". However, the configuration of the driver 140 of FIG. 14 may be a configuration, and it may be understood that the configuration of the driver 140 may be variously modified or changed to be different from the configuration of FIG. 14.

Turned-on transistors may provide a current path for a write current I1/I2. Accordingly, the transistors PU1 to PUp and the transistors PD1 to PDp may drive the write current I1/I2 based on the first code value CVU and the second code value CVD.

For example, in the case where one or more of the transistors PU1 to PUp are turned on and the transistors PD1 to PDp are turned off, a voltage of the first bit line BL1 may be pulled up to the first power supply voltage VDD. In this case, the write current I1 may be provided from the first bit line BL1 to the first source line SL1.

In contrast, in the case where the transistors PU1 to PUp are turned off and one or more of the transistors PD1 to PDp are turned on, a voltage of the first bit line BL1 may be pulled down to the second power supply voltage VSS. In this case, the write current I2 may be provided from the first source line SL1 to the second bit line BL1. A data state of the memory cell MC may depend on the write current I1/I2.

The number of transistors to be turned on from among the transistors PU1 to PUp may vary depending on bits of the first code value CVU. The number of transistors to be turned on from among the transistors PD1 to PDp may vary depending on bits of the second code value CVD. The intensity of the write current I1/I2 may vary depending on the number of turned-on transistors.

As the number of turned-on transistors increases, the intensity of the write current I1/I2 may increase. The intensity of the write current I1/I2 may correspond to a sum of intensities of currents driven by turned-on transistors. Accordingly, the intensity of the write current I1/I2 may be adjusted based on the first code value CVU and the second code value CVD.

According to the above description, the write driver 140 may be configured to drive write currents with different magnitudes/intensities. A value of the write current I1/I2 flowing through the memory cell MC may be adjusted to have one of the different intensities provided by the write driver 140.

Figure 15:
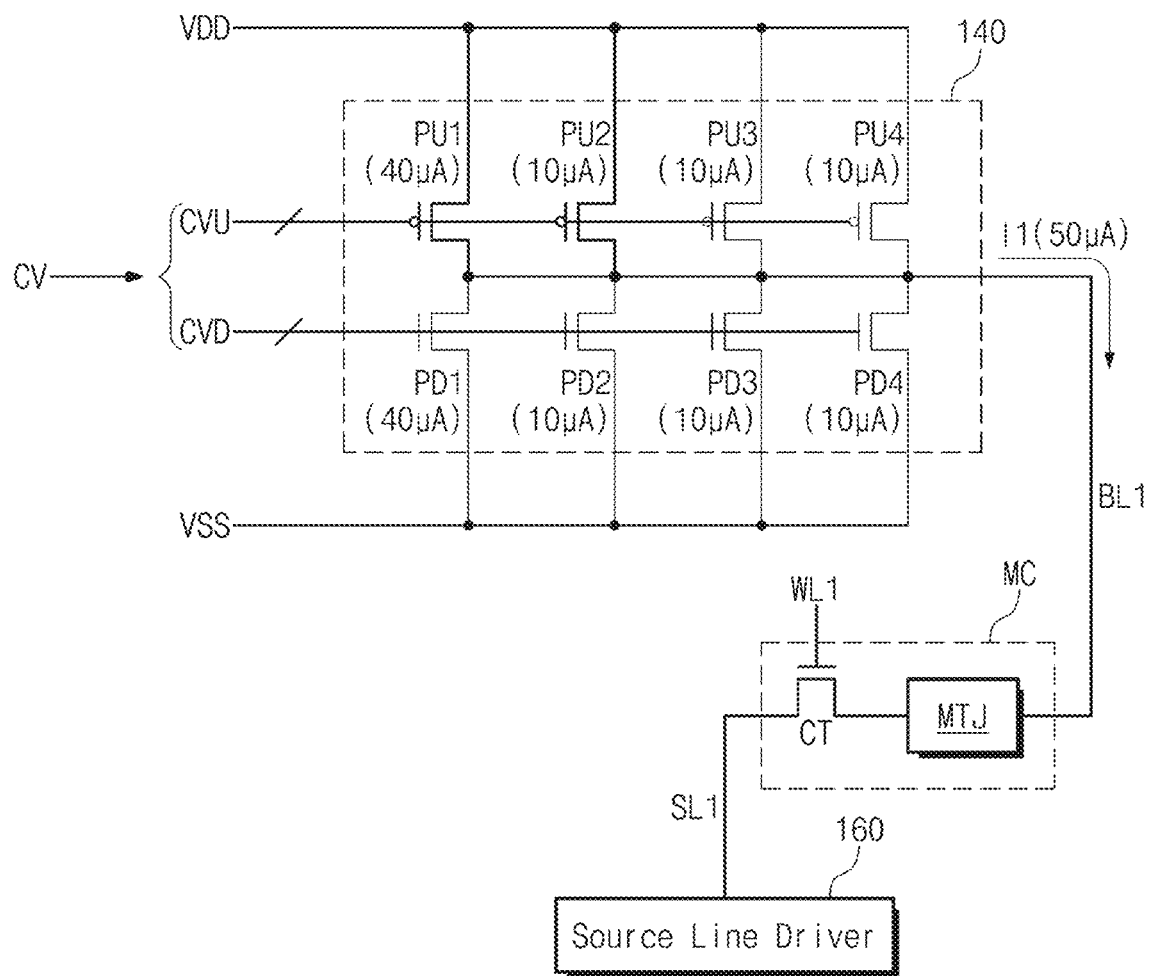
FIGS. 15 and 16 illustrate operations of a driver operating based on a code value output from a voltage generator of FIG. 14.
Figure 16:
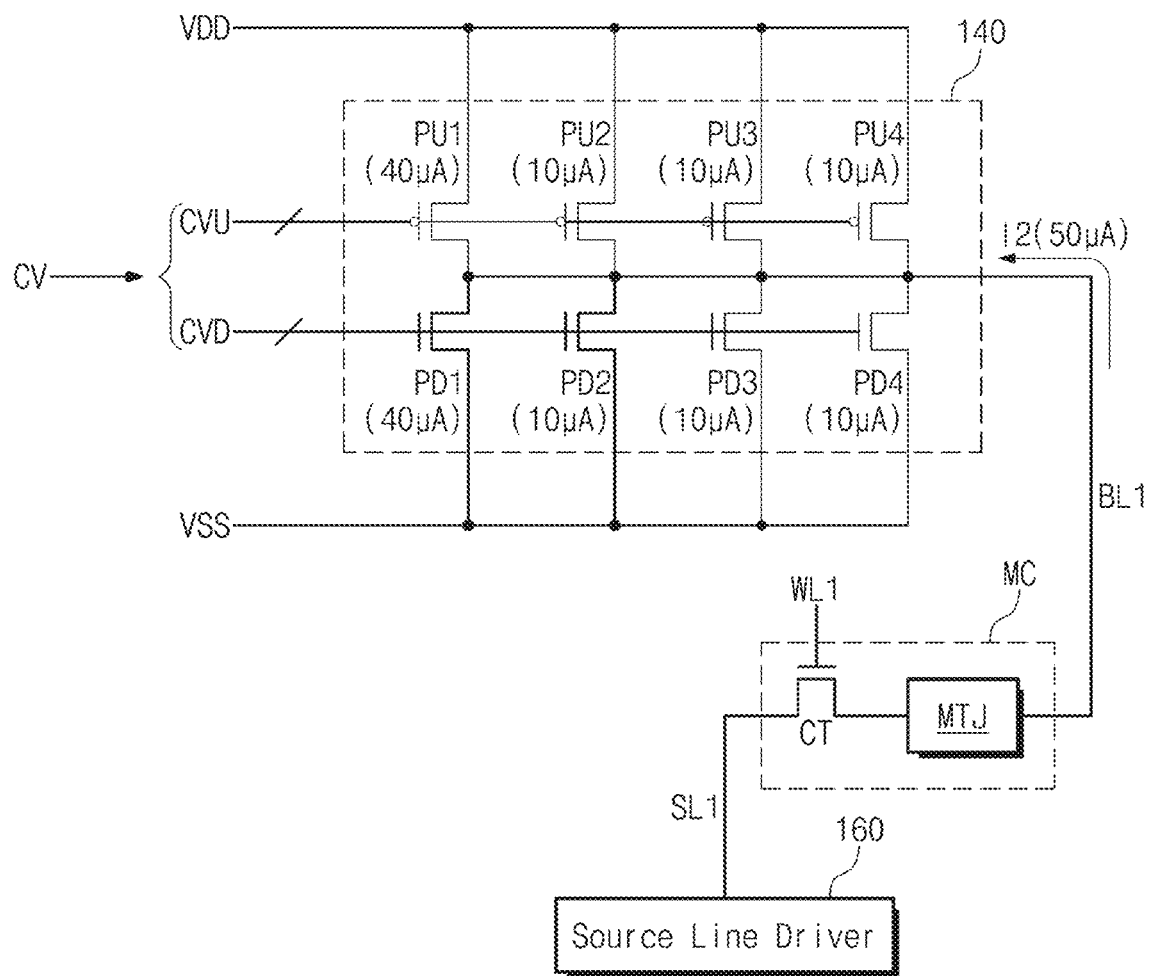

FIGS. 15 and 16 illustrate operations of the driver 140 operating based on the code value CV output from the voltage generator 182 of FIG. 14.

Referring to FIGS. 15 and 16, the driver 140 may include transistors PU1 to PU4 and transistors PD1 to PD4. For example, each of the transistors PU1 and PD1 may have a channel width for driving a current of 40 μA, and each of the transistors PU2 to PU4 and PD2 to PD4 may have a channel width for driving a current of 10 μA.

In some example embodiments, FIG. 15 may be associated with the case where the driver 140 pulls up a voltage of the first bit line BL1 to the first power supply voltage VDD. In the embodiment of FIG. 15, the driver 140 may be provided with voltages corresponding to the first code value CVU of "0011" and voltages corresponding to the second code value CVD of "0000" from the voltage generator 182 (refer to FIG. 14).

Referring to FIG. 15, the transistors PD1 to PD4 may be turned off in response to the second code value CVD. The transistors PU1 and PU2 may be turned on in response to bits having logic "0" from among bits of the first code value CVU, and the transistors PU3 and PU4 may be turned off in response to bits having logic "1" from among the bits of the first code value CVU. Accordingly, the write current I1 of 50 μA may be driven through the turned-on transistors PU1 and PU2.

In some example embodiments, FIG. 16 may be associated with the case where the driver 140 pulls down a voltage of the first bit line BL1 to the second power supply voltage VSS. In the embodiment of FIG. 16, the driver 140 may be provided with the first code value CVU of "1111" and the second code value CVD of "1100" from the voltage generator 182.

Referring to FIG. 16, the transistors PU1 to PU4 may be turned off in response to the first code value CVU. The transistors PD1 and PD2 may be turned on in response to bits having logic "1" from among bits of the second code value CVD, and the transistors PD3 and PD4 may be turned off in response to bits having logic "0" from among the bits of the second code value CVD. Accordingly, the write current I2 of 50 μA may be driven through the turned-on transistors PD1 and PD2.

In some example embodiments, example embodiments of FIG. 15 may be associated with the case of storing data of logic "0" in the memory cell MC, and the embodiment of FIG. 16 may be associated with the case of storing data of logic "1" in the memory cell MC. For example, to provide a code value of the mapping table illustrated in FIG. 10 to the transistors PU1 to PU4 and PD1 to PD4 constituting the driver 140, the voltage generator 182 may include components such as a switch and a multiplexer.

As described with reference to FIGS. 14 to 16, the occurrence of fail bits may decrease by performing a write operation by using an improved/optimal write voltage (or current) determined in the process of testing the memory device. As a result, the reliability of the memory device may be improved. Alternatively or additionally, the endurance of the memory device may be improved by preventing or reducing the likelihood of a write operation from being performed by using an excessive write voltage (or current).

Figure 17:
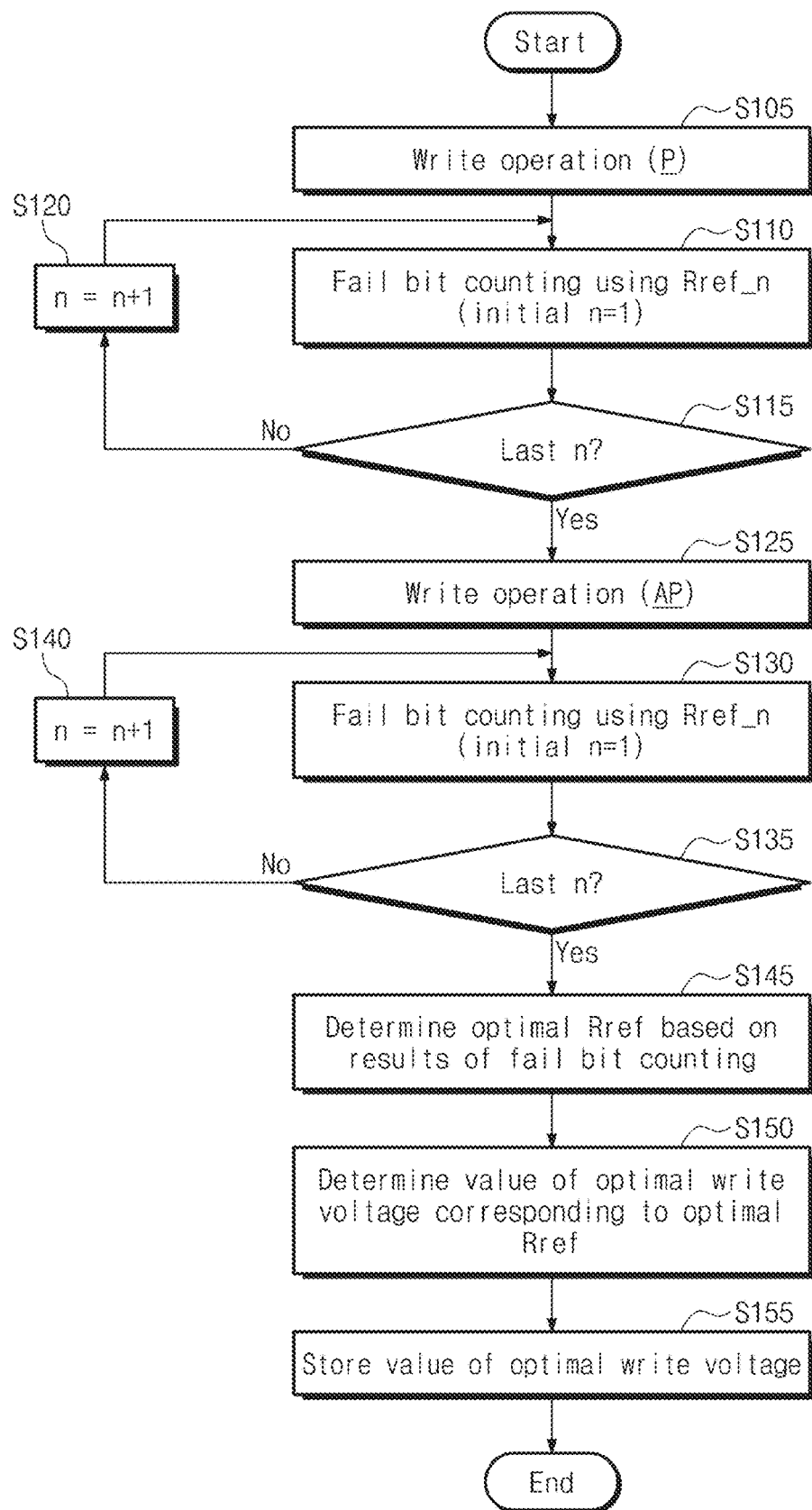
FIG. 17 is a flowchart illustrating a test method of a memory device according to some example embodiments of inventive concepts.

FIG. 17 is a flowchart illustrating a test method of a memory device according to some example embodiments of inventive concepts.

In operation S105, a write operation may be performed on a memory device. For example, the test device may write memory cells constituting the memory device to have the resistance distribution Rp of the parallel state of FIG. 9.

In operation S110, fail bit counting may be performed on the memory device. In some example embodiments, the test device may count the number of fail bits of memory cells while varying a value of the reference resistor Rref. For example, the expression that an initial value of the reference resistor Rref is "1" may only mean an order of a reference resistor to be used in the test operation and may not be associated with a detailed reference resistor value. For example, a value of the reference resistor Rref, which is first selected, may not indicate a low, e.g. the smallest value or very near the smallest value, of reference resistor values to be used to perform the test operation and may be any value selected by a memory fabricator/vendor.

Afterwards, the test device may count the number of fail bits of memory cells while varying a value of the reference resistor Rref (i.e., may repeatedly perform operation S110, operation S115, and operation S120). As the fail bit counting operations using all reference resistors provided for the test operation are completed, the fail bit counting operation associated with the parallel state may end.

In operation S125, a write operation may be performed on a memory device. For example, the test device may write the memory cells constituting the memory device to have the resistance distribution Rap of the anti-parallel state of FIG. 9.

In operation S130, fail bit counting may be performed on the memory device. In some example embodiments, the test device may count the number of fail bits of memory cells while varying a value of the reference resistor Rref. As in the fail bit counting associated with the parallel state, a value of the reference resistor Rref selected in the fail bit counting may be randomly selected from provided reference resistor values regardless of an order of the reference resistor values.

The test device may count the number of fail bits of the memory cells while changing a value of the reference resistor Rref (i.e., may repeatedly perform operation S130, operation S135, and operation S140); when the fail bit counting operations using all reference resistor values provided for the test operation are completed, the fail bit counting operation associated with the anti-parallel state may end.

In operation S145, a value of an improved/optimal reference resistor may be determined based on fail bit counting results. For example, the test device may add the number of fail bits counted in the parallel state and the number of fail bits counted in the anti-parallel state, for each of reference resistor values, and may select a value of a reference resistor corresponding to a low, e.g. the smallest or very near the smallest, for example +/−10% of the smallest, addition result as a value of an improved/optimal reference resistor.

In operation S150, a value of an improved or optimal write voltage (or current) corresponding to the value of the best reference resistor may be determined. In some example embodiments, a value of a reference resistor and a value of a write voltage may have the tendency (e.g., an inversely proportional relationship or a reciprocal relationship) like the graph illustrated in FIG. 10. Accordingly, a relatively small write voltage (or current) may be required to write a memory device (e.g., C1 of FIG. 1) formed relatively close to the periphery of the substrate 1 (refer to FIG. 1). In contrast, a relatively great write voltage (or current) may be required to write a memory device (e.g., C2 of FIG. 1) formed relatively close to the center of the substrate 1.

In operation S155, the value of the best write voltage (or current) may be stored in the memory device. In some example embodiments, the value of the best reference resistor and the value of the best write voltage (or current) may be stored in the memory device. Alternatively or additionally, as illustrated in FIG. 10, a mapping table in which a value of a write voltage corresponding to a value of each reference resistor is defined may be stored in a memory device. In this case, a value of a reference resistor and a value of a write voltage corresponding to a memory device that is provided to the end user may be directed in a write operation. In some example embodiments, the value of the best reference resistor, the value of the write voltage corresponding thereto, and/or the table may be stored in an anti-fuse array or the like of the memory device, but the present disclosure is not limited thereto.

Figure 18:
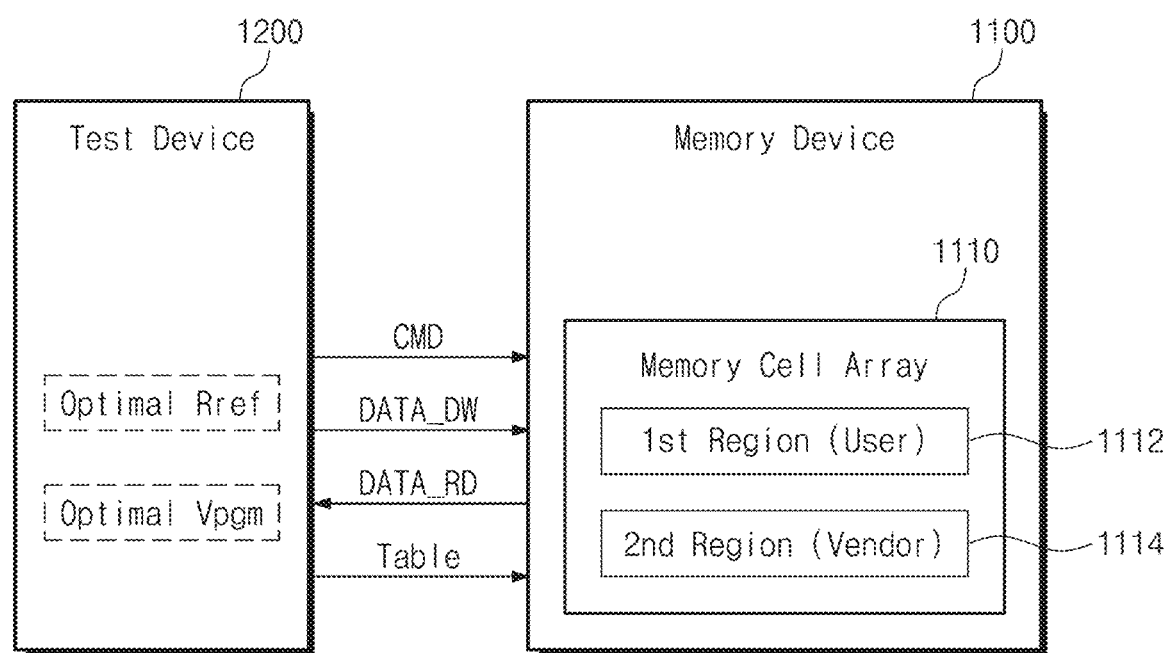
FIG. 18 illustrates a test system according to some example embodiments of inventive concepts.

FIG. 18 illustrates a test system according to some example embodiments of inventive concepts. A test system 1000 may include a memory device 1100 and a test device 1200.

The memory device 1100 includes a memory cell array 1110. In some example embodiments, the memory device 1100 may be an implementation example of the memory device 100 described with reference to FIGS. 1 to 17. The memory cell array 1110 may include a first region 1112 and a second region 1114. For example, the first region 1112 that is a user region may be a region in which data intended by the user are stored. The second region 1114 that is a vendor region may be a region in which data intended by a memory fabricator/vendor are stored. For example, a value of an improved/optimal reference resistor and a value of an improved/optimal write voltage described with reference to FIGS. 1 to 17 may be stored in the second region 1114.

The test device 1200 may perform various test operations on the memory device 1100. To this end, the test device 1200 may transmit a command CMD to the memory device 1100.

In some example embodiments, the command CMD may include a command for writing the first region 1112 of the memory cell array 1110 to a specific write state (e.g., the parallel state or the anti-parallel state). The test device 1200 may transmit dummy write data DATA_DW for writing the first region 1112 to the parallel state or the anti-parallel state together with transmitting the command CMD.

In some example embodiments, the command CMD may direct a read operation for counting the number of fail bits every reference resistor with regard to the specific write state (e.g., the parallel state or the anti-parallel state). Read data DATA_RD may be received from the memory device 1100 as a read result.

In some example embodiments, the test device 1200 may count the number of fail bits every reference resistor based on the read data DATA_RD received from the memory device 1100, may determine a value of the improved/best reference resistor Rref based on counting results, and may determine a value of an improved/optimal write voltage (or current) based on the value of the best reference resistor Rref.

In some example embodiments, the test device 1200 may store the value of the improved/best reference resistor Rref and the value of an improved/best write voltage (or current) in the memory device 1100 in the form of a table. For example, the table may be stored in the second region 1114 of the memory cell array 110. For example, the second region 1114 may include an anti-fuse cell array.

Meanwhile, some example embodiments are described as the pre-write operation, a fail bit counting operation, an operation of determining a value of an improved/optimal reference resistor, and an operation of determining a value of an improved/optimal write voltage are performed in units of a memory device (e.g., a semiconductor chip). However, in some example embodiments, a value of an improved/optimal write voltage may be determined depending on a different reference, not a memory device (i.e., semiconductor chip) unit. For example, in one memory device, because distances of memory cells from the center of a substrate 1 are different, the memory cells may be classified into a plurality of regions, and a value of an improved/optimal write voltage may be determined for each region.

According some example embodiments, a value of an improved/optimal reference resistor and a value of an improved/optimal write voltage (or current) of a memory device may be determined by performing only two pre-write operations (e.g., respectively associated with the parallel state and the anti-parallel state) on the memory device. Accordingly, a time and/or costs necessary to determine a value of an improved/optimal write voltage may decrease. Alternatively or additionally, because a program operation is performed by using a write voltage (or current), the value of which is determine/optimized according to a characteristic (e.g., a size of an MRAM cell) of the memory device, the reliability and endurance of the memory device may be improved.

According to some example embodiments, it may be possible to determine a value of an improved/optimal reference resistor through a small/minimal number of times of a write operation and determine a value of an improved/optimal write voltage based on the value of the reference resistor thus determined.

In this case, the memory device is prevented from or reduced in likelihood of being written by an excessive voltage (or current), and thus, the endurance of the memory device is improved.

Alternatively or additionally, the memory device is prevented from or reduced in likelihood of being written by an insufficient voltage (or current), and thus, the reliability of the memory device is improved.

While some example embodiments have been described with reference to embodiments thereof, it will be apparent to those of ordinary skill in the art that various changes and modifications may be made thereto without departing from the spirit and scope of the present disclosure as set forth in the following claims.

What is claimed is:

1. An operating method of a memory device, the method comprising:
   writing a memory device to a first state;
   counting fail bits of the memory device that are programmed to the first state by using a first plurality of resistors having different values, the first plurality of resistors corresponding to each of a plurality of reference resistors;
   writing the memory device to a second state;
   counting fail bits of the memory device that are programmed to the second state by using the first plurality of resistors;
   selecting a selected reference resistor from the first plurality of resistors based on (A) counting results associated with the first state and (B) counting results associated with the second state; and
   determining a value of a write voltage for the memory device based on a value of the selected reference resistor.

2. The method of claim 1, wherein the selecting of the selected reference resistor includes selecting the selected reference resistor based on results of summing (A) the counting results associated with the first state and (B) the counting results associated with the second state, for each of the plurality of reference resistors.

3. The method of claim 2, wherein the selecting the selected reference resistor includes selecting a resistor which corresponds to a result associated with a number of fail bits from among the summing results from among the first plurality of resistors.

4. The method of claim 1, further comprising:
   storing the value of the selected reference resistor in the memory device, and
   storing the value of the determined write voltage in the memory device.

5. The method of claim 4, wherein the storing the value of the selected reference resistor and the storing the value of the determined write voltage includes,
   storing the value of the selected reference resistor in an anti-fuse array of the memory device, and
   storing the value of the determined write voltage in the anti-fuse array of the memory device.

6. The method of claim 1, wherein the memory device includes a memory cell array, the memory cell array comprising magnetic random access memory (MRAM) cells.

7. A memory device comprising:
   a memory cell array including a first region and a second region, the second region configured to store a value of a reference resistor and a value of a write voltage, the value of the write voltage determined based on the value of the reference resistor, the value of the reference resistor determined based on (A) a first result of counting a number of fail bits of the first region programmed to a first state for each resistance value of a plurality of resistance values and (B) a second result of counting a number of fail bits of the first region programmed to a second state for each resistance value of the plurality of resistance values;

a column decoder configured to select a bit line connected with a memory cell, the memory cell selected from memory cells of the first region;

a row decoder configured to drive a word line connected with the selected memory cell;

a voltage generator configured to generate a code value based on the value of the write voltage; and a write driver configured to drive a write current and to provide the driven write current to the selected memory cell through the selected bit line, the write current being a current for storing data in the selected memory cell, the write current based on the code value.

8. The memory device of claim 7, wherein each of the memory cells of the first region includes:

a cell transistor including a first end, a second end, and a gate electrode, the first end connected with a source line and the gate electrode connected with a first word line from among a plurality of word lines; and a magnetic tunneling junction including a first end and a second end, the first end of the magnetic tunneling junction connected with the second end of the cell transistor and the second end of the magnetic tunneling junction connected with a first bit line from among a plurality of bit lines.

9. The memory device of claim 7, further comprising:

a sensing circuitry configured to perform a read operation on the selected memory cell, wherein the sensing circuitry includes, a first current source configured to generate a first read current, a second current source configured to generate a second read current, and a sense amplifier configured to amplify a difference between (A) a first voltage drop at a first node according to an application of the first read current to the bit line connected with the selected memory cell and (B) a second voltage drop at a second node according to an application of the second read current to a reference bit line.

10. The memory device of claim 7, wherein the write driver includes:

at least one first type of transistor, each of the at least one first type of transistor including a first end connected with a first power supply voltage and a second end connected with an output node; and at least one second type of transistor, each of the at least one second type of transistor including a first end connected with a second power supply voltage and a second end connected with the output node.

11. The memory device of claim 10, wherein the code value includes a first code value and a second code value, the at least one first type of transistors are configured to receive bits of the first code value from the voltage generator, respectively, and the at least one second type of transistors are configured to receive bits of the second code value from the voltage generator, respectively.

12. The method of claim 1, wherein the memory device comprises a memory cell array that includes a first region and a second region, and wherein the value of the selected reference resistor is determined by comparing a voltage drop across a first reference bit line in the first region with a voltage drop across a second reference bit line in the second region.

13. The memory device of claim 7, wherein the value of the reference resistor determined by comparing a voltage drop across a first reference bit line in the first region with a voltage drop across a second reference bit line in the second region.

* * * * *